United States Patent
Trofimenko et al.

(10) Patent No.: US 8,127,214 B2
(45) Date of Patent: Feb. 28, 2012

(54) UNIFIED DECODER FOR CONVOLUTIONAL, TURBO, AND LDPC CODES

(75) Inventors: Alexey Trofimenko, St. Petersburg (RU); Andrey Efimov, St. Petersburg (RU); Andrey V Belogolovy, St. Petersburg (RU); Vladislav A Chernyshev, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 1067 days.

(21) Appl. No.: 11/989,448

(22) PCT Filed: Jun. 14, 2007

(86) PCT No.: PCT/RU2007/000328
§ 371 (c)(1),
(2), (4) Date: Jan. 25, 2008

(87) PCT Pub. No.: WO2008/153436
PCT Pub. Date: Dec. 18, 2008

(65) Prior Publication Data
US 2010/0146360 A1 Jun. 10, 2010

(51) Int. Cl.
*H03M 13/03* (2006.01)
(52) U.S. Cl. .................................................. 714/786
(58) Field of Classification Search .......... 714/786, 714/794–796, 800–801
See application file for complete search history.

(56) References Cited

U.S. PATENT DOCUMENTS

| | | | |
|---|---|---|---|
| 6,304,996 B1 * | 10/2001 | Van Stralen et al. | 714/796 |
| 6,865,710 B2 * | 3/2005 | Bickerstaff et al. | 714/796 |
| 6,865,711 B2 * | 3/2005 | Arad et al. | 714/796 |
| 7,191,377 B2 | 3/2007 | Berens et al. | |
| 2005/0149838 A1 | 7/2005 | Chiueh | |
| 2006/0294446 A1 | 12/2006 | Chun et al. | |

FOREIGN PATENT DOCUMENTS

| | | |
|---|---|---|
| EP | 1158682 A2 | 11/2001 |
| EP | 1204211 A1 | 5/2002 |

OTHER PUBLICATIONS

Mansour, Unified decoder architectures for repeat accumulate & LDPC codes, 2004, IEEE, p. 527-531.*
Fan-Min Li et al., Unified convolutional/Turbo decoder architecture design based on triple-mode MAP/VA kernel, 2004, IEEE p. 1073-1076.*
Bickerstaff, M. A., et al., "A Unified Turbo/Vitebri Channel Decoder for 3GPP Mobile Wireless in 0.18-μm CMOS", *IEEE Journal of Solid-State Circuits*; 37(11), (Nov. 2002),1555-1564.
Yanping, L. et al., "New Implementation for the Scalable LPDC-Decoders", *Proc. Vehicular Technology conference 2004*, vol. 1, (May 17, 2004),343-346.
Mansour, M. M., et al., "Memory-efficient turbo decoder architectures for LDPC codes", *proc. IEEE Workshop on Signal Processing System 2002*, (Oct. 16, 2002),159-164.
*International Search Report / Written Opinion* for PCT Patent Application No. PCT/RU2007/000328, (May 23, 2008),18 Pages.
Li, Yanping, et al., "New implementation for the scalable LDPC-decoders", Vehicular Technology Conference, vol. 1, May 17-19, 2004, pp. 343-346. Abstract only.

* cited by examiner

*Primary Examiner* — Shelly A Chase
(74) *Attorney, Agent, or Firm* — Thorpe North & Western LLP

(57) ABSTRACT

A unified decoder is capable of decoding data encoded with convolutional codes, Turbo codes, and LDPC codes. In at least one embodiment, a unified decoder is implemented within a multi-standard wireless device.

15 Claims, 10 Drawing Sheets

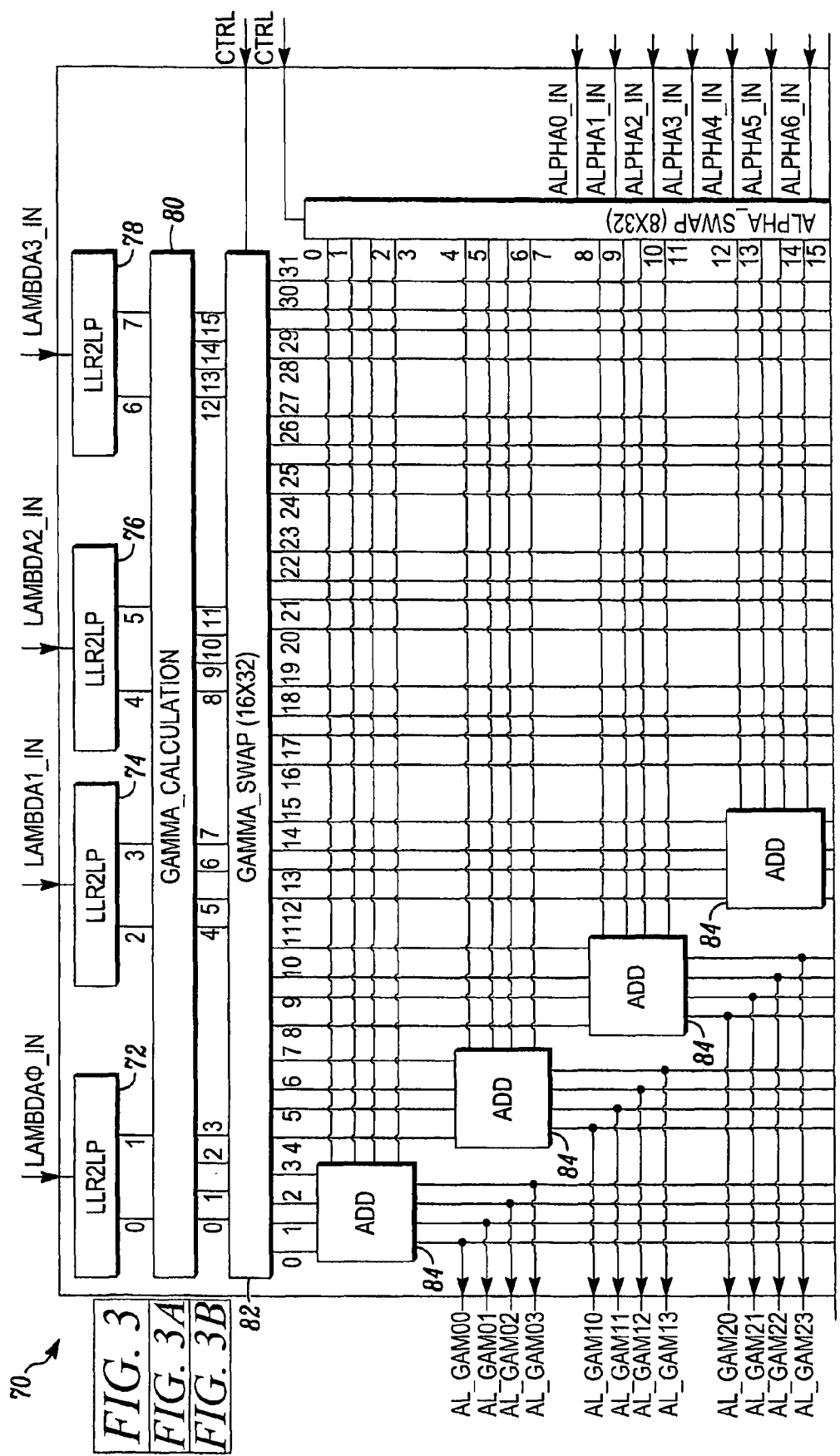

UNIFIED DECODER FOR CONVOLUTIONAL, TURBO, AND LDPC CODES

TECHNICAL FIELD

The invention relates generally to digital decoding and, more particularly, to techniques for implementing a unified decoder that can decode multiple types of FEC code.

BACKGROUND OF THE INVENTION

Many electronic devices are currently being equipped with wireless circuitry that supports multiple wireless standards. For example, a laptop computer may be equipped with circuitry supporting a wireless local area network (LAN) standard, a wireless wide area network (WAN) standard, and a 3GPP cellular telephone standard. In many cases, separate circuitry may be provided to support each wireless standard. However, it would be more efficient and provide cost savings if one or more circuit components could be shared among the various wireless standards being supported.

BRIEF DESCRIPTION OF THE DRAWINGS

FIGS. 3A and 3B are block diagrams illustrating portions of an example trellis processor in accordance with an embodiment of the present invention;

DETAILED DESCRIPTION

Figure 1:
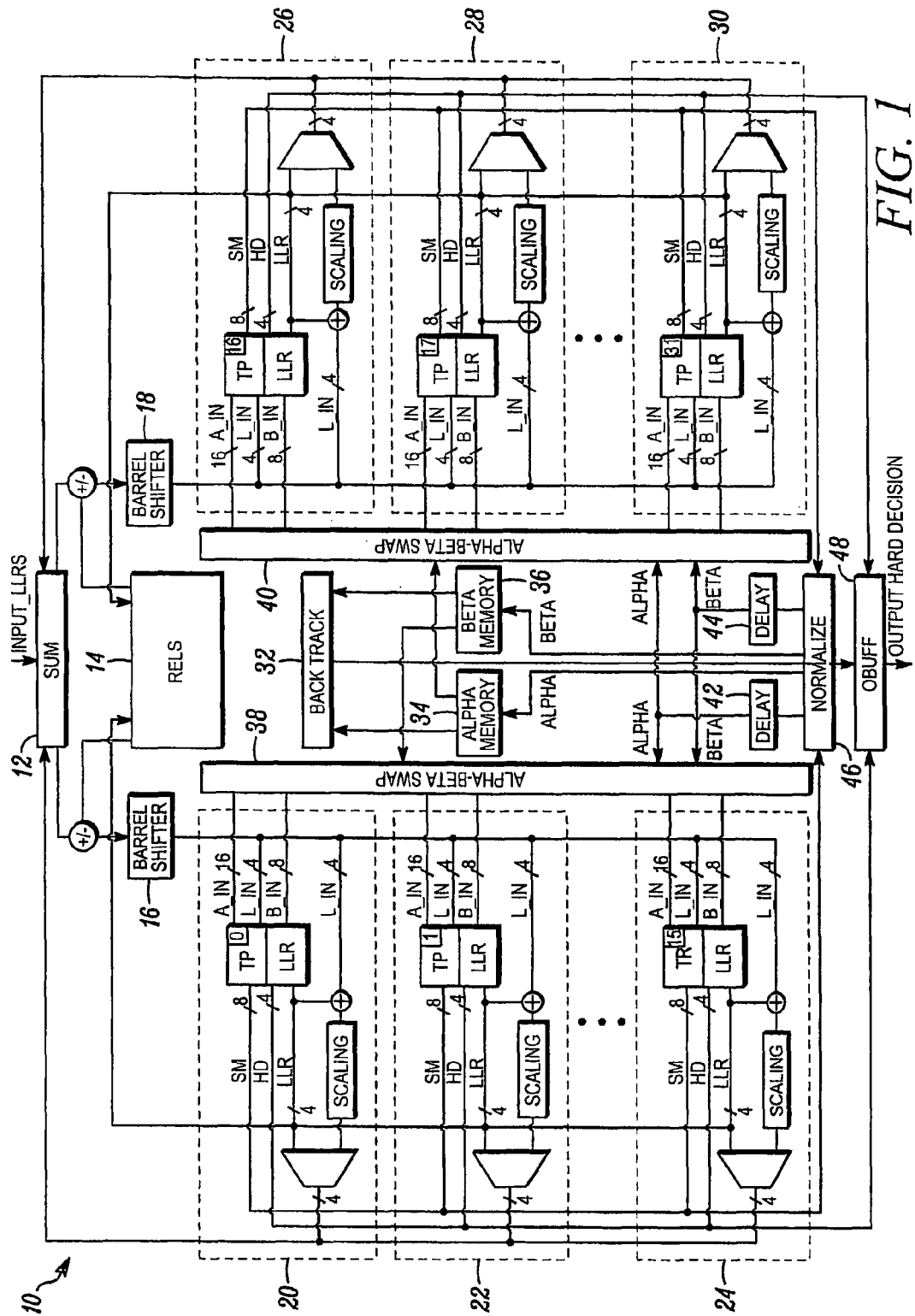
FIG. 1 is a block diagram illustrating an example unified decoder in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to a unified decoder that is capable of decoding data encoded with convolutional, Turbo, and low density parity check (LDPC) codes. The unified decoder may be used in, for example, a wireless device to provide multi-standard support. In at least one implementation, the unified decoder is realized as a single decoder chip that may be shared by the various standards being supported by a device. By sharing a single decoder chip, circuit implementation costs may be reduced considerably over designs that use separate decoder chips for each wireless standard being supported. A single decoder chip also takes up considerably less space on a circuit board than multiple chips would.

FIG. 1 is a block diagram illustrating an example unified decoder 10 in accordance with an embodiment of the present invention. As will be described in greater detail, the unified decoder 10 can be used to decode data that was encoded with convolutional codes, Turbo codes, and low density parity check (LDPC) codes. All of these code types can be decoded using a trellis-based decoding approach. The unified decoder 10 uses dynamically configurable trellis decoding circuitry that can be quickly reconfigured to work with different types of FEC codes. For convolutional codes, the unified decoder may be configured to perform Viterbi decoding. For Turbo and LDPC codes, the unified decoder may be configured to perform Bahl, Cocke, Jelinik, and Raviv (BCJR) decoding. In at least one embodiment, the unified decoder is implemented within a multi-standard wireless communication device where it can be reconfigured on the fly based on a wireless standard that is currently active within the device. As depicted in FIG. 1, the unified decoder 10 is capable of use with all of the FEC codes specified by the IEEE 802.16e wireless networking standard, the proposed IEEE 802.11n wireless networking standard, and the 3GPP TS25.212 wireless cellular standard. In other embodiments, other wireless standards may be supported.

With reference to FIG. 1, in the illustrated embodiment, the unified decoder 10 includes: a SUM block 12; a RELS block 14; first and second barrel shifters 16, 18; a plurality of metric computation units 20, 22, 24, 26, 28, 30; a back track unit 32; an alpha memory (stack) 34; a beta memory (stack) 36; first and second alpha-beta swap units 38, 40; first and second delay units 42, 44; a normalization unit 46; and an output buffer 48. The SUM block 12 is a memory that receives input reliabilities that are to be processed by the unified decoder 10. The input reliabilities may be received from, for example, a demodulator within a receiver of a wireless device carrying the decoder 10. The RELS block 14 is a memory that stores intermediate reliability values that are generated during the various iterations of the decoding process. Although illustrated as separate memories, it should be appreciated that a single memory structure may be used for both purposes. The barrel shifters 16, 18 are used to reorder the reliabilities read from the SUM and RELS blocks 12, 14 for processing within the metric computation units 20, 22, 24, 26, 28, 30. As will be described in greater detail, the metric computation units 20, 22, 24, 26, 28, 30 are operative for calculating the metrics and reliabilities that are used during Viterbi and BCJR decoding processes. During Viterbi decoding, for example, the metric computation units 20, 22, 24, 26, 28, 30 may generate state metrics (SM). During BCJR decoding, the metric computation units 20, 22, 24, 26, 28, 30 may generate alpha (forward) metrics, beta (backward) metrics, and intermediate reliability (e.g., LLR) values. As is well known, the Viterbi and BCJR decoding processes are iterative techniques.

The normalization unit 46 is operative for normalizing the metrics generated during the decoding process. As the decoding process proceeds, the generated metrics typically get larger and larger. Normalization is performed to prevent overflow from occurring with these progressively increasing metrics. The alpha and beta memories (stacks) 34, 36 are used to store normalized alpha and beta metrics for further usage during BCJR decoding. During Viterbi decoding, the alpha and beta memories 34, 36 are used to store path metrics for eventual use by the back track unit 32 to reconstruct the most likely codeword. The back track unit 32 performs a trace back operation through the trellis, along a selected path, to determine the most likely data string that was originally encoded. The back track unit 32 is not used during BCJR decoding. In at least one embodiment, the back track unit 32 is powered down during BCJR decoding. The delay blocks 42, 44 are storage units that are used to delay/store normalized metrics from a previous trellis stage for use in the next iteration/stage of the trellis processing. The alpha-beta swap units 38, 40 are used to controllably distribute metrics from the previous trellis stage (stored in the delay blocks 42, 44) and/or from the alpha and beta memories 34, 36 for subsequent processing in the metric computation units 20, 22, 24, 26, 28, 30. The alpha-beta swap units 38, 40 and other circuitry within the metric computation units 20, 22, 24, 26, 28, 30 may be reconfigured by a controller during decoder operation based on a FEC code presently being utilized. The output buffer (OBUFF) 48 is operative for storing hard decisions generated during decoding operations, for output. During Viterbi decoding, the output hard decisions are received from the back track unit 32. During BCJR decoding (i.e., for decoding Turbo and LDPC codes), the hard decisions are generated by the metric computation units 20, 22, 24, 26, 28, 30.

Figure 2:
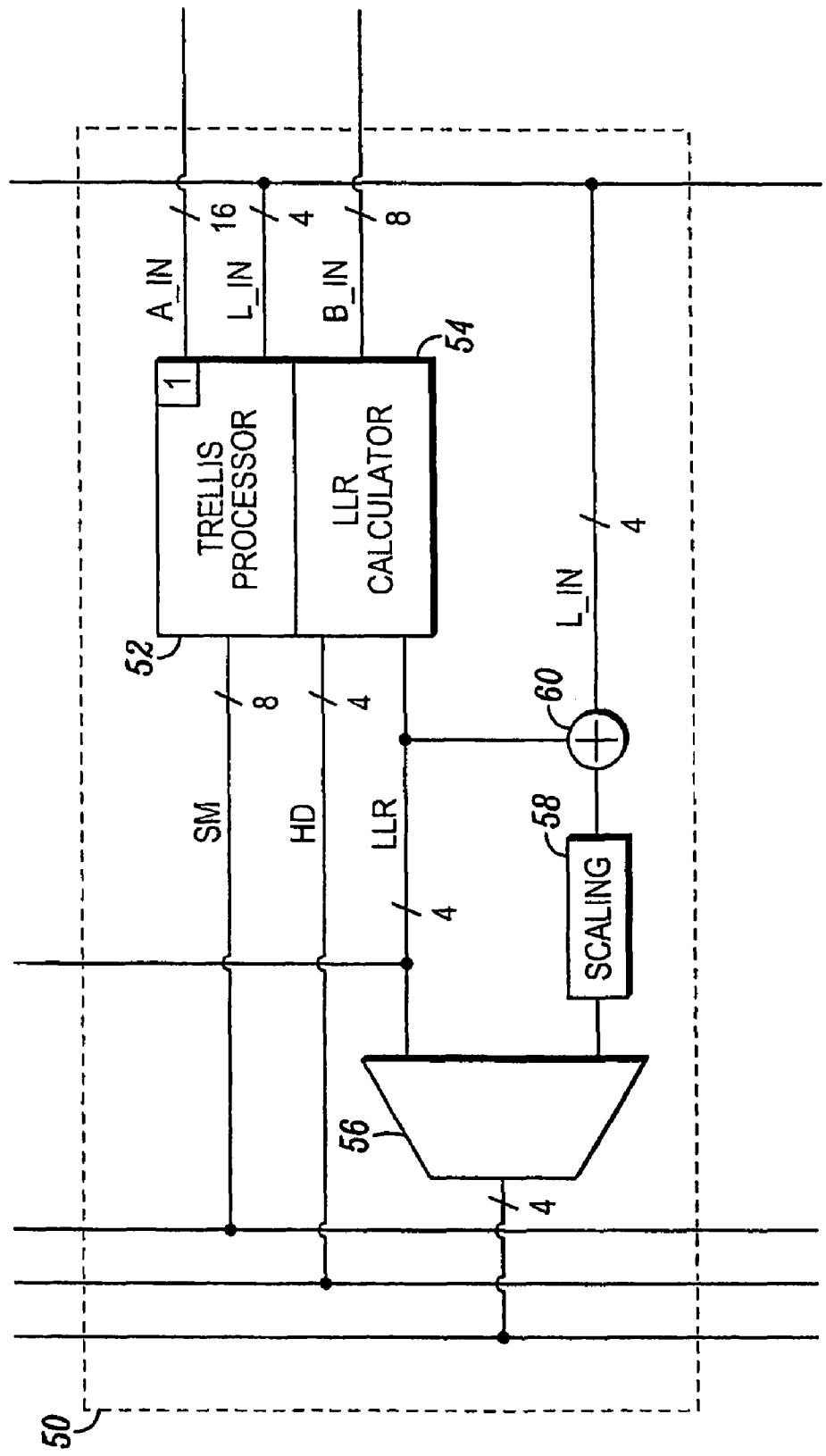
FIG. 2 is a block diagram illustrating an example metric computation unit in accordance with an embodiment of the present invention.

FIG. 2 is a block diagram illustrating an example metric computation unit 50 in accordance with an embodiment of the present invention. The metric computation unit 50 may be used, for example, within the unified decoder 10 of FIG. 1. The number of metric computation units 50 that are used within a unified decoder will depend upon the particular codes that are being utilized. In the illustrated embodiment, thirty two metric computation units are used. As illustrated, the metric computation unit 50 includes: a trellis processor (TP) 52, a log likelihood ratio (LLR) calculator 54, a multiplexer 56, a scaling block 58, and an adder 60. The TP 52 is used to calculate alpha and beta metrics during BCJR decoding (for Turbo and LDPC codes) and path metrics during Viterbi decoding (for convolutional codes). The generated metrics may be delivered from the TP 52 to a normalization unit for normalization (e.g., normalization block 46 of FIG. 1). In the illustrated embodiment, each TP 52 can process up to eight states of a corresponding trellis. During Viterbi decoding, for example, a particular TP 52 may perform as eight (or less) add-compare-select (ACS) units simultaneously for calculating path metrics for corresponding states of the Viterbi trellis. In general, a trellis may be implemented that has an arbitrary number of states. In other embodiments, a different number of states may be handled by each TP 52.

The LLR calculator 54 calculates output reliabilities during BCJR decoding, based on alpha and beta metrics. The LLR calculator 54 is not used during Viterbi decoding. In at least one embodiment, the LLR calculator 54 is powered down during Viterbi decoding operations. As shown in FIG. 1, the output LLR values generated by the LLR calculator 54 may be delivered to the RELS memory 14 for use in subsequent decoding iterations. The scaling block 58 multiplies the reliability (e.g., the LLR values) received from the LLR calculator 54 by a scaling factor that is usually less than 1 (e.g., 0.75 in at least one embodiment). In some cases, enhanced decoding results may be achieved by using such a scaling factor. The multiplexer 56 selects either the reliability output by the LLR calculator 54 or the scaled reliability output by the scaling block 58 for storage in the SUM memory 12 (see FIG. 1).

As described previously, the unified decoder of FIG. 1 may be used to decode data encoded with convolutional codes, Turbo codes, and LDPC codes. In at least one embodiment, the unified decoder is designed to work with all codes specified within the IEEE 802.16e standard, the proposed IEEE 802.11n standard, and the 3GPP TS25.212 standard. The IEEE 802.16e standard permits the use of convolutional codes, Turbo codes, and LDPC codes. The proposed IEEE 802.11n standard specifies the use of LDPC codes and convolutional codes. The 3GPP TS25.212 standard permits the use of convolutional codes and Turbo codes. TABLES 1-3 below specify the code parameters, the required throughput, and the trellis parameters for the various covered codes in one embodiment. TABLE 1 corresponds to LDPC codes, TABLE 2 corresponds to convolutional codes, and TABLE 3 corresponds to Turbo codes. As described previously, in the embodiment of FIG. 1, each trellis processor can process up to eight trellis states in a single clock cycle. As shown in TABLE 3, this coincides with

TABLE 1

| Standard | Code Rate (R) | Submatrix Size (Z) | Message Length (K) | Maximum Trellis Length | Required Throughput, Mbit/s |
|---|---|---|---|---|---|
| IEEE 802.16e | ½ | 24 . . . 96, divisible 4 | 288 . . . 1152 | 7 | 36 |
|  | ⅔ | 24 . . . 96, divisible 4 | 384 . . . 1536 | 11 | 48 |
|  | ¾ | 24 . . . 96, divisible 4 | 432 . . . 1728 | 15 | 54 |
|  | ⅚ | 24 . . . 96, divisible 4 | 480 . . . 1920 | 20 | 60 |
| IEEE 802.11n | ½ | 27, 54, 81 | 324, 648, 972 | 8 | 52 |
|  | ⅔ | 27, 54, 81 | 432, 864, 1296 | 11 | 104 |
|  | ¾ | 27, 54, 81 | 486, 972, 1458 | 15 | 117 |
|  | ⅚ | 27, 54, 81 | 540, 1080, 1620 | 22 | 130 | the number of trellis states associated with each of the supported Turbo codes. This number is also divisible into the number of states in each of the supported LDPC codes of TABLE 1. In the illustrated embodiment, therefore, a trellis processor can process

TABLE 2

| Standard | Code Rate (R) | Trellis Width | Trellis Length | Message Length (K) | Required Throughput, Mbit/s |
|---|---|---|---|---|---|
| IEEE 802.16e | ½ | 64 | 48 | 48 | 36 |
|  | ½ | 64 | 96 | 96 | 36 |
|  | ½ | 64 | 144 | 144 | 36 |

TABLE 2-continued

| Standard | Code Rate (R) | Trellis Width | Trellis Length | Message Length (K) | Required Throughput, Mbit/s |
|---|---|---|---|---|---|
| | ½ | 64 | 192 | 192 | 36 |
| | ½ | 64 | 240 | 240 | 36 |
| | ½ | 64 | 288 | 288 | 36 |
| | ⅔ | 64 | 192 | 192 | 48 |
| | ¾ | 64 | 72 | 72 | 54 |
| | ¾ | 64 | 144 | 144 | 54 |
| | ¾ | 64 | 216 | 216 | 54 |
| | ¾ | 64 | 288 | 288 | 54 |
| | ⅚ | 64 | 288 | 288 | 60 |
| 3GPP TS25.212 | ½ | 256 | 504 | 504 | 50 |
| | ⅓ | 256 | 504 | 504 | 33 |
| IEEE 802.11n | ½ | 64 | UP TO 4096 | UP TO 4096 | 52 |
| | ⅔ | 64 | UP TO 4096 | UP TO 4096 | 104 |
| | ¾ | 64 | UP TO 4096 | UP TO 4096 | 117 |
| | ⅚ | 64 | UP TO 4096 | UP TO 4096 | 130 | a single trellis stage within one clock cycle for most of the supported Turbo and LDPC codes.

With reference to TABLE 2, each of the supported convolutional codes specified in the IEEE 802.16e standard (and the IEEE 802.11n standard) utilizes a trellis having a trellis width of 64. One stage of the trellis can therefore be processed by eight trellis processors within a single clock cycle in the illustrated embodiment. For convolutional codes associated with the 3GPP TS25.212 standard, the trellis width is 256. One stage of the trellis may therefore be processed by all 32 trellis processors within a single clock cycle in the illustrated embodiment. To achieve the throughputs specified by the supported standards (see TABLES 1-3), 32 trellis processors are required to operate in parallel.

TABLE 3

| Standard | Code Rate (R) | Trellis Width | Trellis Length | Message Length (K) | Required Throughput, Mbit/s |
|---|---|---|---|---|---|
| IEEE 802.16e | ½ | 8 | 24 | 48 | 48 |
| | ½ | 8 | 48 | 96 | 48 |
| | ½ | 8 | 72 | 144 | 48 |
| | ½ | 8 | 96 | 192 | 48 |
| | ½ | 8 | 120 | 240 | 48 |
| | ½ | 8 | 144 | 288 | 48 |
| | ½ | 8 | 192 | 384 | 48 |
| | ½ | 8 | 216 | 432 | 48 |
| | ½ | 8 | 240 | 480 | 48 |
| | ⅔ | 8 | 96 | 192 | 54 |
| | ⅔ | 8 | 192 | 384 | 54 |
| | ¾ | 8 | 36 | 72 | 60 |
| | ¾ | 8 | 72 | 144 | 60 |
| | ¾ | 8 | 108 | 216 | 60 |
| | ¾ | 8 | 144 | 288 | 60 |
| | ¾ | 8 | 180 | 360 | 60 |
| | ¾ | 8 | 216 | 432 | 60 |
| | ⅚ | 8 | 120 | 240 | 60 |
| | ⅚ | 8 | 240 | 480 | 60 |
| 3GPP TS25.212 | ⅓ | 8 | 5114 | 5114 | 33 |

Figure 3B:
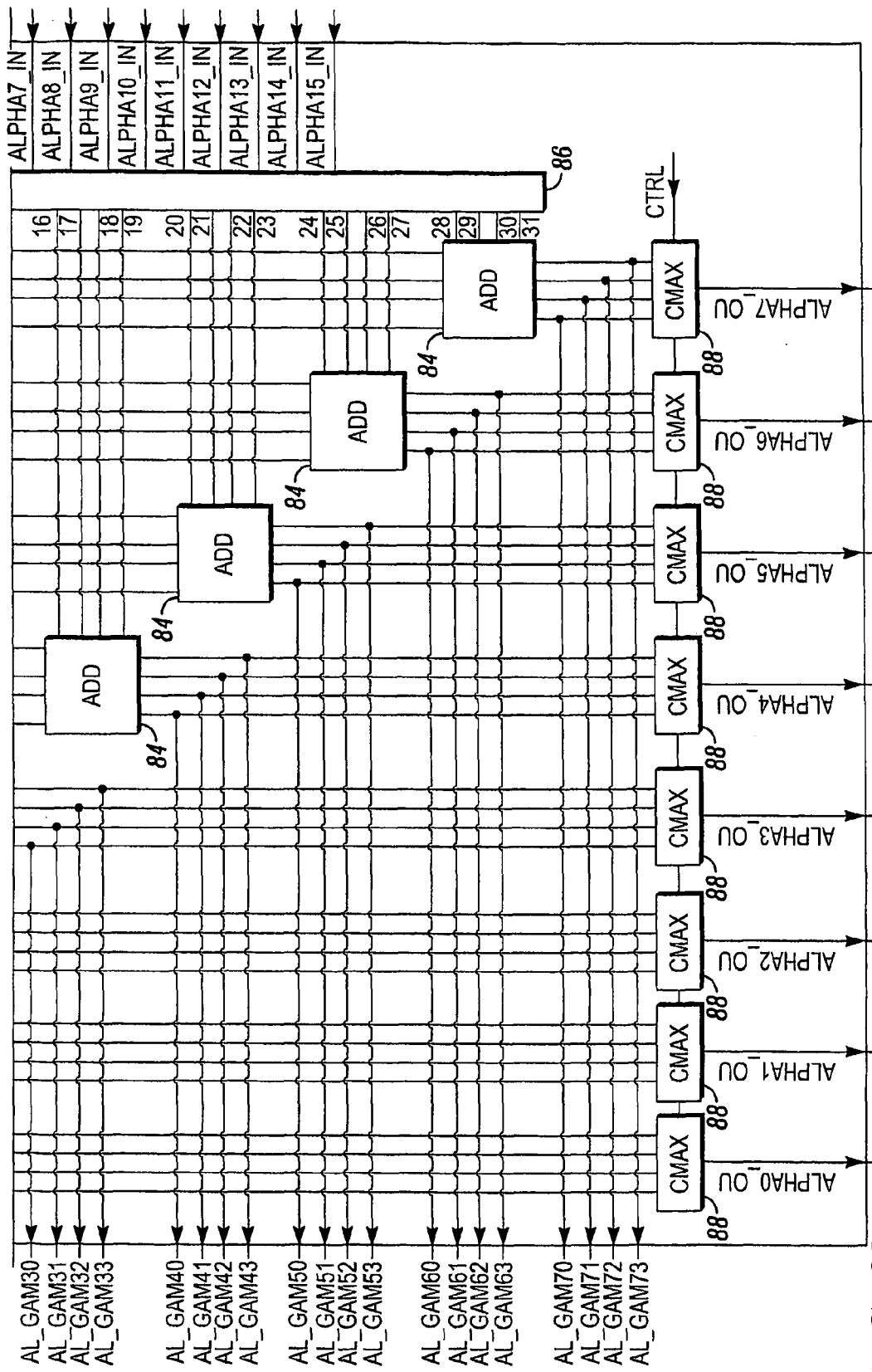

FIGS. 3A and 3B are block diagrams illustrating portions of an example trellis processor 70 in accordance with an embodiment of the present invention. The trellis processor 70 may be used within, for example, the metric computation unit 50 of FIG. 2. The trellis processor 70 receives input reliabilities (lambda 0_in through lambda 3_in) and metrics from a previous trellis stage (alpha 0_in through alpha 15_in) and uses them to generate updated metrics for a current trellis stage (alpha 0_ou through alpha 7_ou). As illustrated in FIGS. 3A and 3B, the trellis processor 70 includes: a plurality of LLR2Lp blocks 72, 74, 76, 78; a gamma calculator 80; a gamma swap unit 82; a plurality of ADD blocks 84; an alpha (or beta) swap unit 86; and a plurality of CMAX blocks 88. In the illustrated embodiment, the input reliabilities (lambda 0_in, lambda 1_in, lambda 2_in, lambda 3_in) are received by the LLR2Lp blocks 72, 74, 76, 78 from a barrel shifter within the unified decoder (e.g., barrel shifter 16 in FIG. 1). The LLR2Lp blocks 72, 74, 76, 78 and the gamma calculator 80 then use the input reliabilities to calculate all possible edge metrics on the trellis edges.

Each ADD block 84 corresponds to one state in a decoding trellis. As described previously, each trellis processor processes eight trellis states in the illustrated embodiment; therefore, there are eight ADD blocks 84. In other embodiments, a different number of states may be processed by each trellis processor. Each ADD block 84 adds the edge metrics for edges coming into the corresponding state to corresponding paths metrics for paths that pass over the edges. The gamma swap unit 82 and the alpha swap unit 86 are used to controllably distribute the appropriate edge metrics and path metrics to the ADD blocks 84. Each ADD block 84 has a corresponding CMAX block 88 that receives the updated path metrics for the corresponding trellis state and selects the best metric (alpha 0_ou through alpha 7_ou) for that state for continued processing in the trellis. This best metric is then output from the trellis processor (to, for example, a normalization unit). The output metrics for each trellis state may be output to a corresponding LLR calculation block for use in calculating reliabilities for backward passage through the trellis during BCJR decoding.

Figure 4:
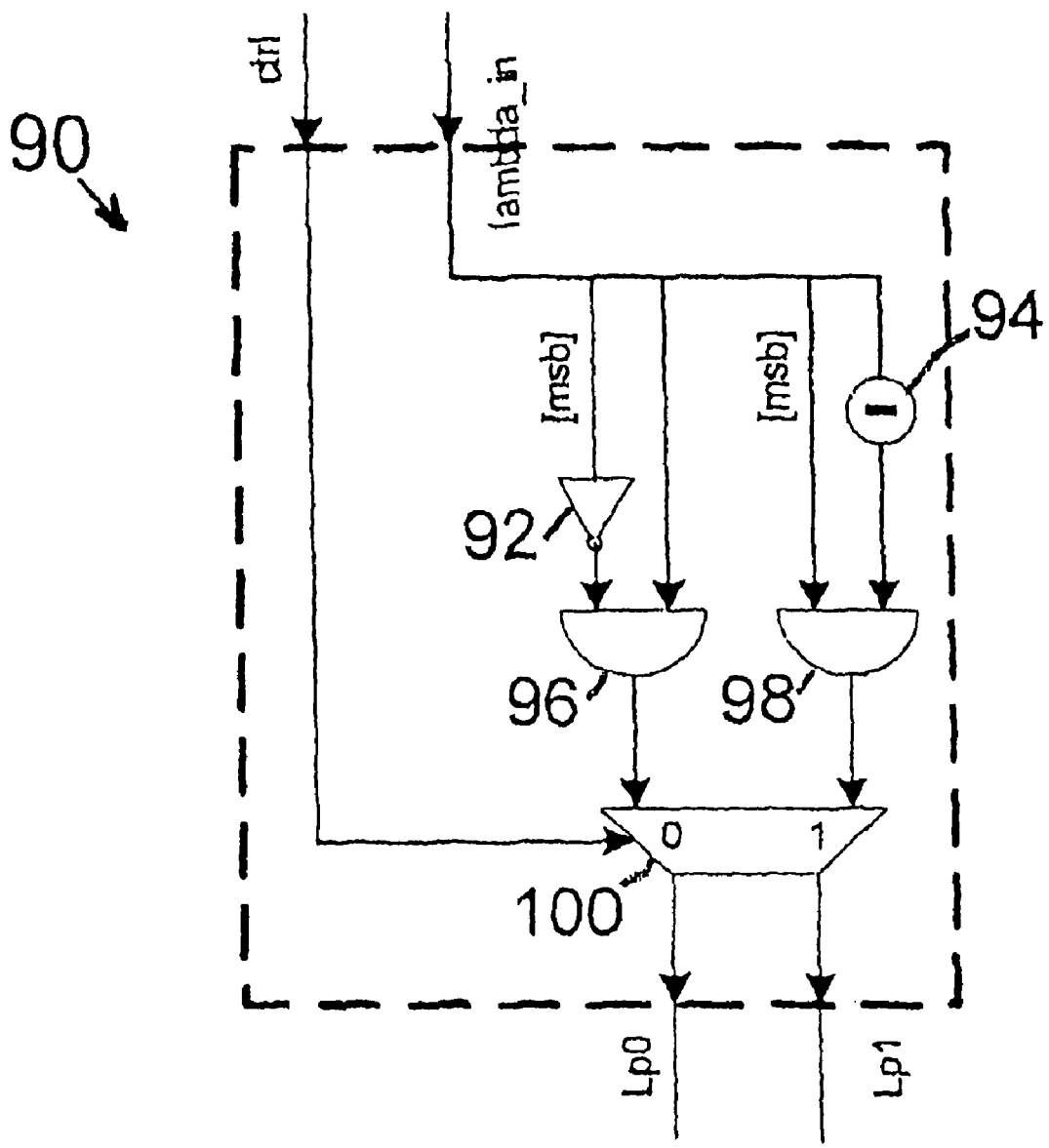
FIG. 4 is a block diagram illustrating example circuitry within an LLR2Lp block in a trellis processor in accordance with an embodiment of the present invention.

FIG. 4 is a block diagram illustrating example circuitry 90 within an LLR2Lp block in a trellis processor (e.g., LLRLp block 72 in FIG. 3A) in accordance with an embodiment of the present invention. As shown, the circuitry 90 may include: an inverter 92; a unary minus 94; and first and second AND gates 96, 98. The circuitry 90 computes an approximation of the probability that a bit with given reliability (lambda_in) is equal to 1 (Lp1 represents the approximation of the logarithm of such reliability) and an approximation of the probability that the given bit is equal to 0 (Lp0).

Figure 5:
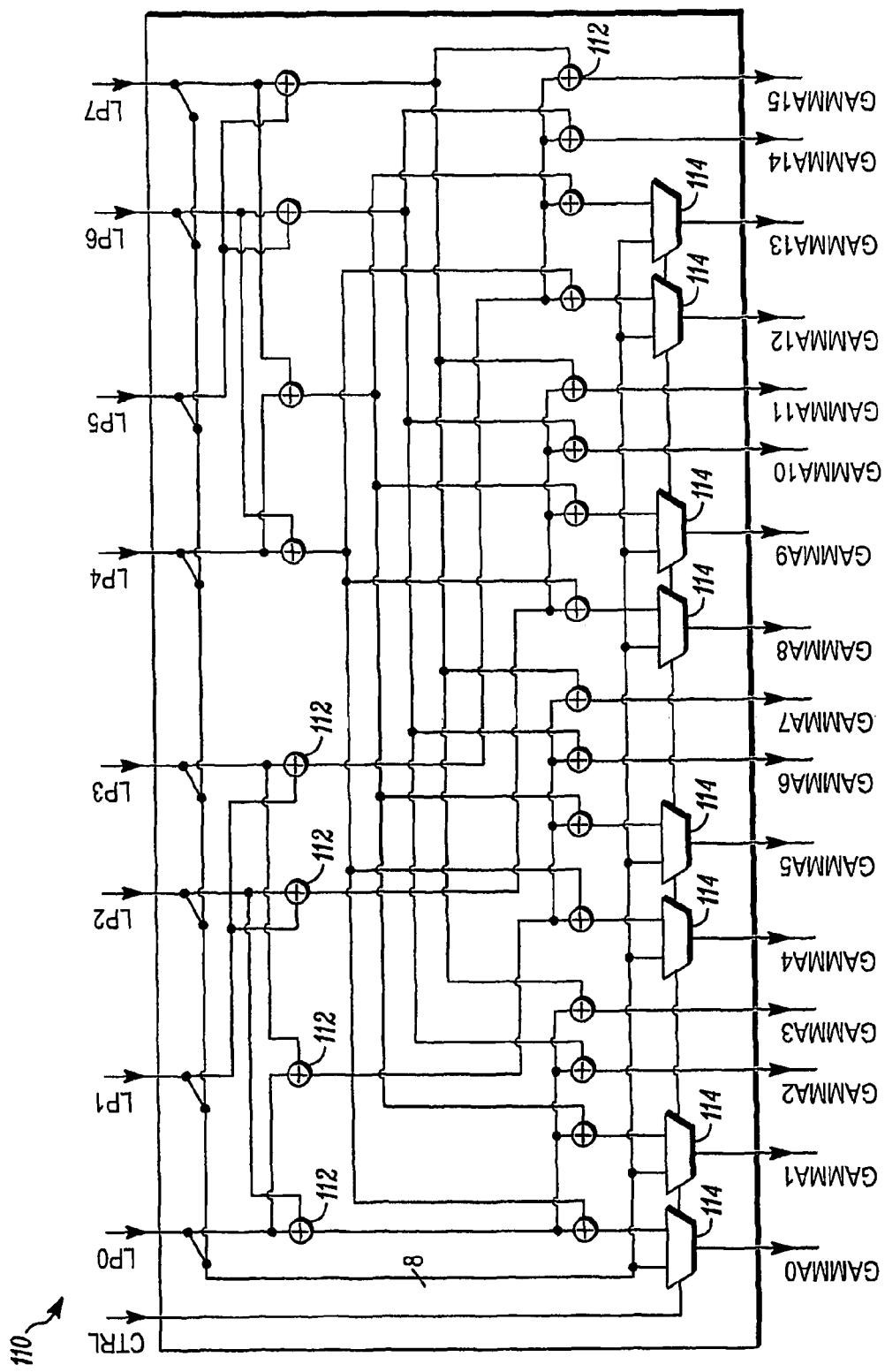
FIG. 5 is a block diagram illustrating example circuitry within a gamma calculator in a trellis processor in accordance with an embodiment of the present invention.

FIG. 5 is a block diagram illustrating example circuitry 110 within a gamma calculator in a trellis processor (e.g., gamma calculator 80 of FIG. 3A) in accordance with an embodiment of the present invention. As shown, the circuitry 110 may include a plurality of adders 112 and a plurality of multiplexers 114. The circuitry 110 computes all possible values of the edge metric (part of a path metric for the Viterbi decoding or part of the alpha or beta metric for BCJR decoding which corresponds only to the current trellis section). Edge metric values for the given edge of the trellis are computed based on the values of input reliabilities and the values of message and parity bits which correspond to the given trellis edge. All combinations of bits are presented on the edges in one trellis section. Depending on the trellis structure, some (or all) combinations are repeated on more then one edge. The edge metrics are computed in the decoder in circuitry 110 and are then re-ordered in the gamma-swap so that each trellis processor receives necessary edge metrics.

Figure 6:
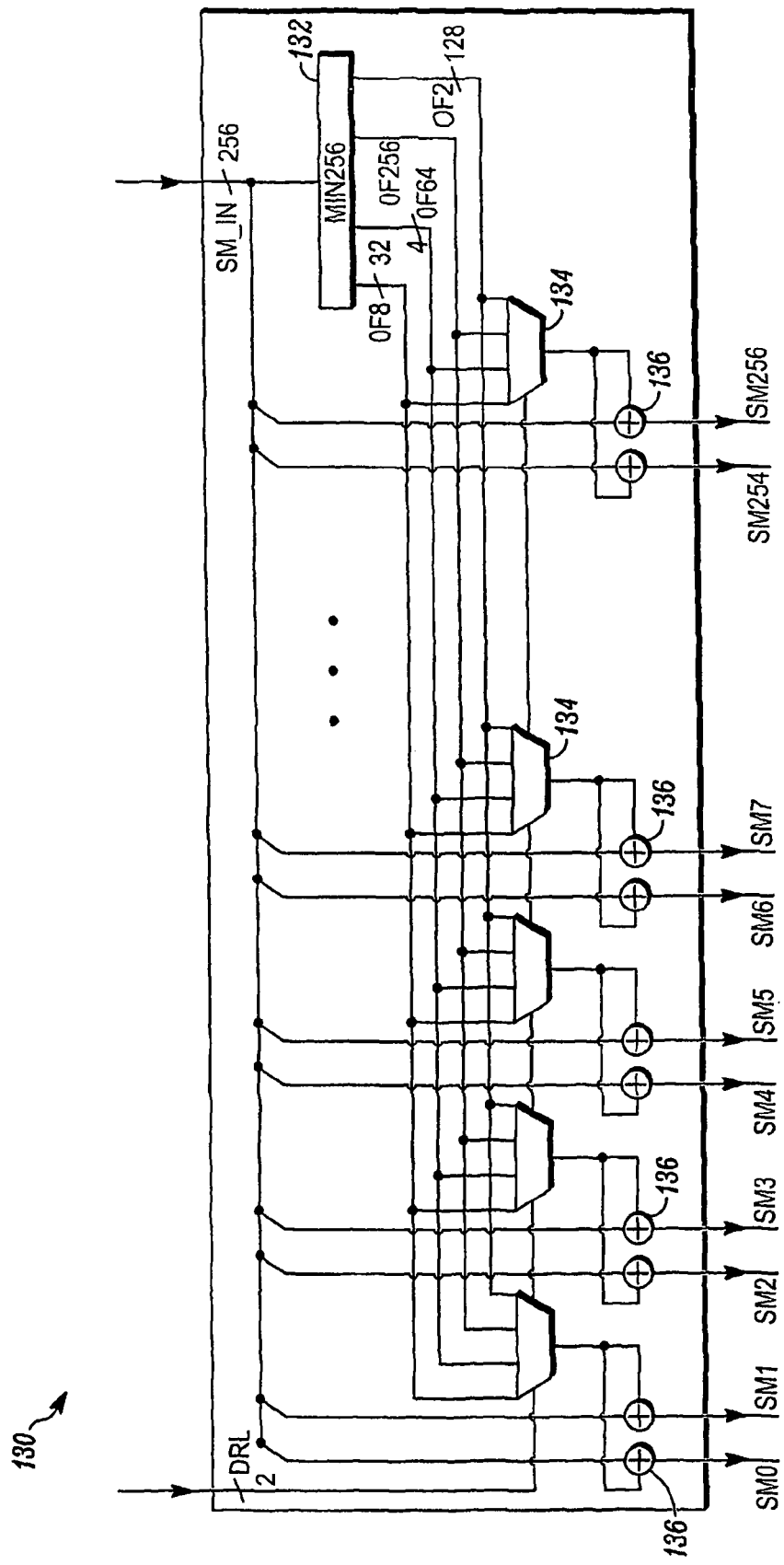
FIG. 6 is a block diagram illustrating example circuitry within a metric normalization unit in accordance with an embodiment of the present invention.

FIG. 6 is a block diagram illustrating example circuitry 130 within a metric normalization unit (e.g., normalization block 46 of FIG. 1) in accordance with an embodiment of the present invention. As shown, the circuitry 130 may include, for example, a minimum unit 132, a plurality of multiplexers 134, and a plurality of adders 136. The normalization process may operate as follows. For LDPC codes, for example, for each pair of input metric values (received via SM_IN), a minimum value is found and subtracted from each input metric value. For Turbo and convolutional codes (depending on the trellis width), for each group of 8, 64, or 256 metrics, minimum values (one value for 256 case) are found and subtracted from each metric value in each group. Therefore, the minimum unit 132 computes all possible values of minimums, the multiplexers 134 are used to select required minimum values depending on the current operation mode, and the adders 136 are used to subtract minimum values from input metric values in order to obtain normalized metric values.

Figure 7:
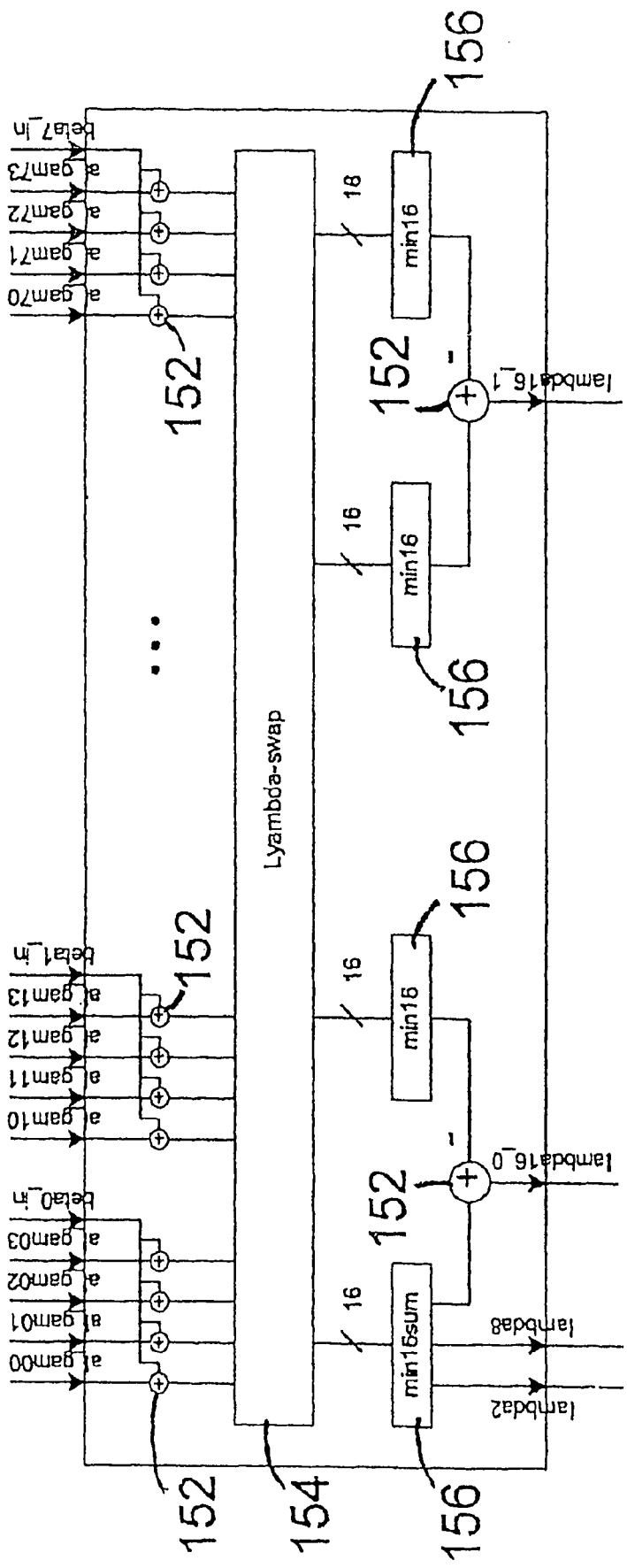
FIG. 7 is a block diagram illustrating example circuitry within an LLR calculator in accordance with an embodiment of the present invention.

FIG. 7 is a block diagram illustrating example circuitry 150 within an LLR calculator (e.g., LLR calculator 54 of FIG. 2) in accordance with an embodiment of the present invention. As shown, the circuitry 150 may include: a plurality of adders 152, a lambda swap unit 154, a plurality of minimum units 156, and a plurality of subtractors 158. In order to compute output reliabilities in the circuitry 150, the following steps are performed. First, for each edge in the trellis, the sum of the alpha metric, the edge metric, and the beta metric are found (using, e.g., adders 152). Next, the resulting sums are grouped into two sets (for trellises with one message bit on a trellis edge) or four sets (for trellises with two message bits on a trellis edge (e.g., IEEE 802.16e turbo code)). When grouped into two sets, the first set is a set of edges for which the message bit value on the edge of the trellis is equal to 0 and the second set is a set of edges for which the message bit value is equal to 1. When grouped into four sets, the first set is a set of edges where message bit 1 is equal to 0 (and bit 2 doesn't matter), the second set for message bit 1 equal to 1, the third set for message bit 2 equal to 0, and the fourth set for message bit 2 equal to 1). Next, the minimum metric value is found for each set (using, e.g., the minimum units 156). Then, for each message bit, the minimum metric value in the set where the bit is equal to 0 has to be subtracted from the minimum metric value in the set where the bit is equal to 1 (using, e.g., subtractors 158). The result of the subtraction is output as the updated reliability (lambdaxxxx).

Figure 8:
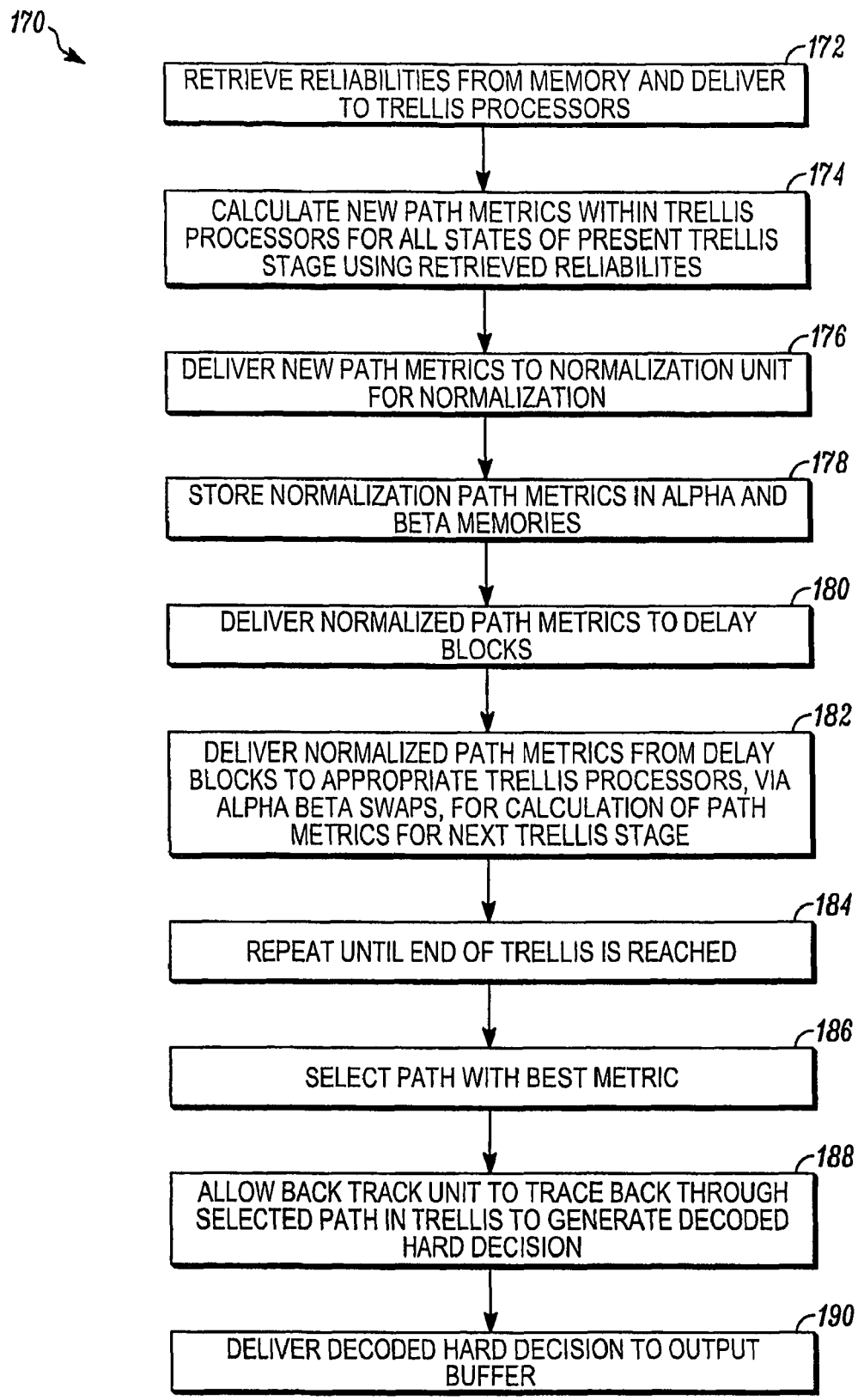
FIG. 8 is a flowchart illustrating an example method for use in operating a unified decoder during convolutional code decoding in accordance with an embodiment of the present invention.

FIG. 8 is a flowchart illustrating an example method 170 for use in operating a unified decoder during convolutional code decoding in accordance with an embodiment of the present invention. As shown, reliabilities are first retrieved from memory (e.g., SUM memory 12 of FIG. 1) and are delivered to the various trellis processors of the unified decoder (block 172). For a convolutional code having code rate 1/2, two reliabilities are delivered to each trellis processor. For a convolutional code having code rate 1/3, three reliabilities are delivered to each trellis processor. Each trellis processor then uses the received reliabilities to calculate new path metrics for corresponding states of the present trellis stage (block 174). The new path metrics are then delivered to the normalization unit to be normalized (block 176).

The normalized path metrics are then stored in the alpha and beta memories for later use (block 178). The normalized path metrics are also delivered to the delay blocks (block 180). From the delay blocks, the normalized path metrics are delivered to the appropriate trellis processors for calculation of path metrics for the subsequent trellis stage (block 182). The alpha-beta swap units are used to appropriately direct the normalized path metrics from the delay units to the trellis processors. This process is then repeated until the end of the trellis is reached (block 184). At this point, a single path through the trellis is selected that has the best overall metric (typically the lowest metric) (block 186). The back track unit is then used to trace back through the trellis along the selected path to generate the decoded hard decision (block 188). The decoded hard decision may then be delivered to the output buffer (block 190). As described previously, the unified decoder does not use the LLR calculators within the metric computation units during convolutional code decoding. In at least one embodiment, the LLR calculators are powered down during convolutional code decoding to conserve energy.

Figure 9:
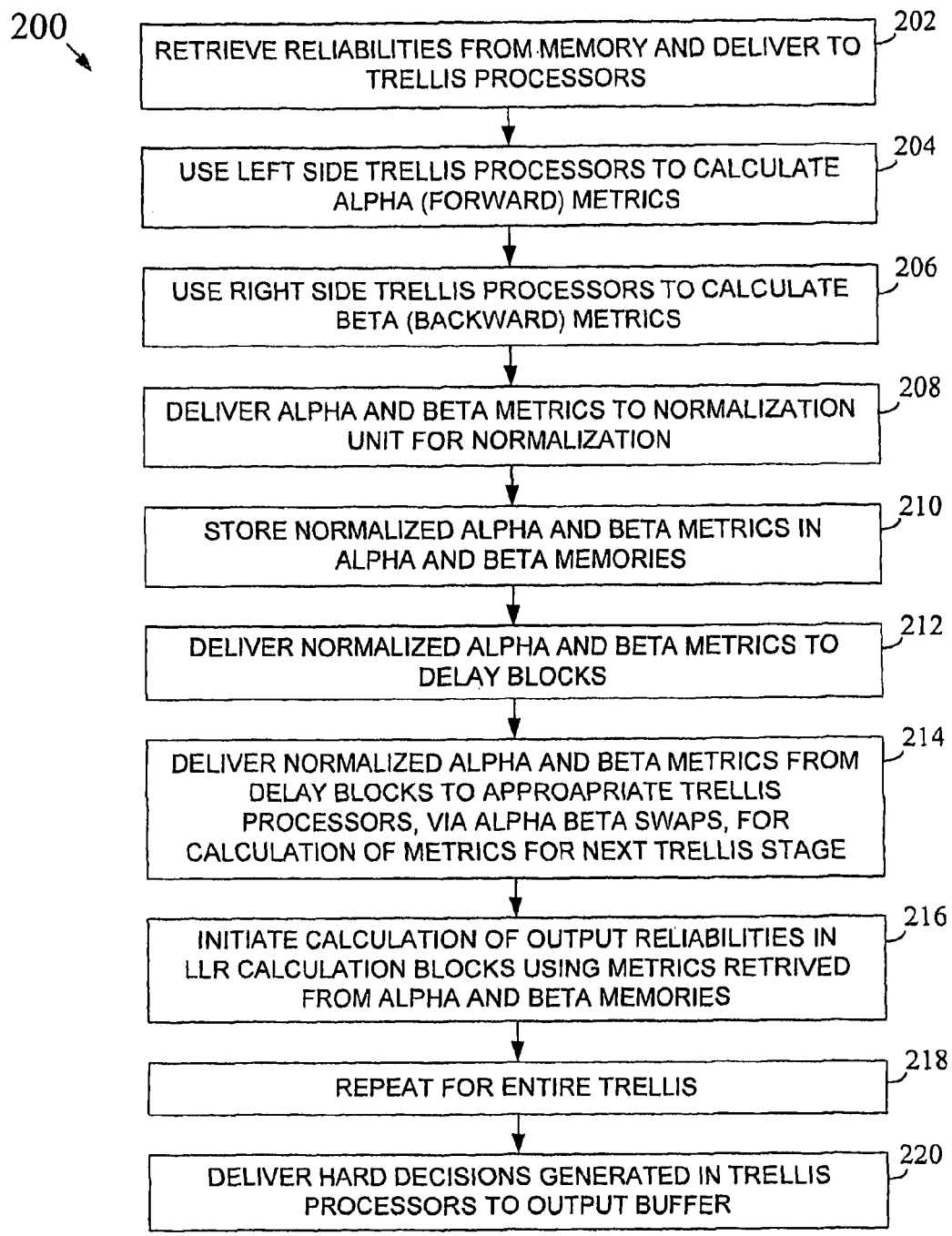
FIG. 9 is a flowchart illustrating an example method for use in operating a unified decoder during Turbo and LDPC code decoding in accordance with an embodiment of the present invention.

FIG. 9 is a flowchart illustrating an example method 200 for use in operating a unified decoder during Turbo and LDPC code decoding in accordance with an embodiment of the present invention. In at least one embodiment, a determination may first be made as to whether encoded data was encoded with a convolutional code, a Turbo code, or an LDPC code. If the data was encoded with a convolutional code, a procedure such as method 170 of FIG. 8 may be followed. If the data was encoded with a Turbo or LDPC code, a procedure such as method 200 of FIG. 9 may be followed. As before, reliabilities are first retrieved from memory (e.g., SUM memory 12 of FIG. 1) and are delivered to the various trellis processors of the unified decoder (block 202). When the Turbo codes of the 3GPP TS25.212 standard are being used, three reliabilities (two intrinsic and one extrinsic) and one write (extrinsic) are retrieved for a trellis processor. When the Turbo codes of the IEEE 802.16e standard are being used, six reliabilities (four intrinsic and two extrinsic) and two writes (extrinsic) are retrieved for a trellis processor. When LDPC codes are being used, eight reliabilities (four extrinsic and four sum) and eight writes (four extrinsic and four sum) are retrieved for a trellis processor. To perform BCJR decoding, the trellis processors are broken up into two groups. The trellis processors on the left side of the unified decoder are used to calculate alpha (forward) metrics (block 204) and the trellis processors on the right side are used to calculate beta (backward) metrics (block 206). In at least one embodiment, there are 16 trellis processors in each group. Other arrangements for splitting up the trellis processors may alternatively be used. Once generated, the alpha and beta metrics are delivered to the normalization unit to be normalized (block 208).

The normalized alpha and beta metrics output by the normalization unit may then be stored in the alpha and beta memories (block 210). The normalized alpha and beta metrics may also be delivered to the delay blocks (block 212). From the delay blocks, the normalized alpha and beta metrics are delivered to appropriate trellis processors for the calculation of metrics for the next trellis stage (block 214). The alpha-beta swap units may be used to appropriately distribute the normalized alpha and beta metrics to the trellis processors. Calculation of output reliabilities in the LLR calculators is then initiated using metrics retrieved from the alpha and beta memories (block 216). The above process is then repeated until the appropriate number of iterations has been reached or exceeded (block 218). In at least one implementation, the process represented by blocks 202 to 218 is repeated approximately 10-15 times for LDPC codes and 4-8 times for Turbo codes. The hard decisions generated in the LLR calculators are delivered to the output buffer (block 220). As described previously, the unified decoder does not make use of the back track unit 32 during Turbo and LDPC based decoding. In at least one embodiment, the back track unit 32 is powered down during Turbo and LDPC code decoding to conserve energy.

As described previously, the unified decoder 10 of FIG. 1 may be reconfigured on the fly for operation with different FEC codes. To reconfigure the decoder 10, control signals may be delivered to the left alpha-beta swap unit 38, the right alpha-beta swap unit 40, and the alpha, beta, and gamma swap units within the trellis processors (see FIGS. 3A and 3B). These swap units may be implemented as, for example, crossbar switches. In at least one embodiment, mode numbers are assigned to identify the operational modes associated with the various supported codes. The mode numbers may be used to determine how to control the various swap units. In one implementation, the mode numbers are assigned as follows:

| FEC CODE | MODE NUMBER |
|---|---|
| IEEE 802.16e, convolutional code | 1 |
| IEEE 802.16e, Turbo code | 2 |
| 3GPP TS25.212, convolutional code, R = ½ | 3 |
| 3GPP TS25.212, convolutional code, R = ⅓ | 4 |
| 3GPP TS25.212, Turbo code | 5 |
| IEEE 802.11n, convolutional code | 6 |

TABLES 4-9 below illustrate how the alpha-beta swap units and the alpha, beta, and gamma swap units are controlled for various operating modes in accordance with an embodiment of the invention. In the tables, the first column indicates the mode number that each row corresponds to. As shown, mode numbers 1 through 6 are represented. The rows starting with MN each list a particular set of inputs of the associated swap unit and the rows following each MN row identify the outputs of the associated swap unit that those inputs will be coupled to for the corresponding operating mode. TABLE 4 is the schedule for the left alpha-beta swap unit. TABLE 5 is the schedule for the right alpha-beta swap unit. TABLE 6 is the schedule for the alpha swap units within the trellis processors that generate alpha metrics (left side in the illustrated embodiment). TABLE 7 is the schedule for the beta swap units within the trellis processors that generate beta metrics (right side in the illustrated embodiment). TABLE 8 is the schedule for the gamma swap units within the trellis processors that generate alpha metrics (left side). TABLE 9 is the schedule for the gamma swap units within the trellis processors that generate beta metrics (right side).

In TABLES 4-9, swap schedules are not given for the supported LDPC codes. This is because the SWAP schedules for these codes are very simple. For example, for the alpha, beta, and gamma swap units within the trellis processors, the i-th input is simply coupled to the i-th output for LDPC codes. For the left and right alpha-beta swap units, the i-th input is coupled to the (i mod 128)-th output.

TABLE 4

LEFT ALPHA-BETA SWAP SCHEDULE

| MN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 1 | 2 | 3 | 4 | 5 | 6 | 7 | 8 | 9 | 10 | 11 | 12 | 13 | 14 | 15 |
| 2 | 0 | 1 | 2 | 3 | 4 | 5 | 6 | 7 | x | x | x | x | x | x | x | x |
| 3 | 0 | 1 | 2 | 3 | 4 | 5 | 6 | 7 | 8 | 9 | 10 | 11 | 12 | 13 | 14 | 15 |
| 4 | 0 | 1 | 2 | 3 | 4 | 5 | 6 | 7 | 8 | 9 | 10 | 11 | 12 | 13 | 14 | 15 |
| 5 | 0 | 1 | 2 | 3 | 4 | 5 | 6 | 7 | x | x | x | x | x | x | x | x |
| 6 | 0 | 1 | 2 | 3 | 4 | 5 | 6 | 7 | 8 | 9 | 10 | 11 | 12 | 13 | 14 | 15 |

| MN | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 1 | 16 | 17 | 18 | 19 | 20 | 21 | 22 | 23 | 24 | 25 | 26 | 27 | 28 | 29 | 30 | 31 |
| 2 | x | x | x | x | x | x | x | x | x | x | x | x | x | x | x | x |
| 3 | 16 | 17 | 18 | 19 | 20 | 21 | 22 | 23 | 24 | 25 | 26 | 27 | 28 | 29 | 30 | 31 |
| 4 | 16 | 17 | 18 | 19 | 20 | 21 | 22 | 23 | 24 | 25 | 26 | 27 | 28 | 29 | 30 | 31 |
| 5 | x | x | x | x | x | x | x | x | x | x | x | x | x | x | x | x |
| 6 | 16 | 17 | 18 | 19 | 20 | 21 | 22 | 23 | 24 | 25 | 26 | 27 | 28 | 29 | 30 | 31 |

| MN | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|
| 1 | 32 | 33 | 34 | 35 | 36 | 37 | 38 | 39 | 40 | 41 | 42 | 43 | 44 | 45 | 46 | 47 |
| 2 | x | x | x | x | x | x | x | x | x | x | x | x | x | x | x | x |
| 3 | 32 | 33 | 34 | 35 | 36 | 37 | 38 | 39 | 40 | 41 | 42 | 43 | 44 | 45 | 46 | 47 |
| 4 | 32 | 33 | 34 | 35 | 36 | 37 | 38 | 39 | 40 | 41 | 42 | 43 | 44 | 45 | 46 | 47 |
| 5 | x | x | x | x | x | x | x | x | x | x | x | x | x | x | x | x |
| 6 | 32 | 33 | 34 | 35 | 36 | 37 | 38 | 39 | 40 | 41 | 42 | 43 | 44 | 45 | 46 | 47 |

| MN | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|
| 1 | 48 | 49 | 50 | 51 | 52 | 53 | 54 | 55 | 56 | 57 | 58 | 59 | 60 | 61 | 62 | 63 |
| 2 | x | x | x | x | x | x | x | x | x | x | x | x | x | x | x | x |
| 3 | 48 | 49 | 50 | 51 | 52 | 53 | 54 | 55 | 56 | 57 | 58 | 59 | 60 | 61 | 62 | 63 |
| 4 | 48 | 49 | 50 | 51 | 52 | 53 | 54 | 55 | 56 | 57 | 58 | 59 | 60 | 61 | 62 | 63 |
| 5 | x | x | x | x | x | x | x | x | x | x | x | x | x | x | x | x |
| 6 | 48 | 49 | 50 | 51 | 52 | 53 | 54 | 55 | 56 | 57 | 58 | 59 | 60 | 61 | 62 | 63 |

| MN | 64 | 65 | 66 | 67 | 68 | 69 | 70 | 71 | 72 | 73 | 74 | 75 | 76 | 77 | 78 | 79 |
|---|---|---|---|---|---|---|---|---|---|---|---|---|---|---|---|---|
| 1 | 0 | 1 | 2 | 3 | 4 | 5 | 6 | 7 | 8 | 9 | 10 | 11 | 12 | 13 | 14 | 15 |
| 2 | x | x | x | x | x | x | x | x | x | x | x | x | x | x | x | x |
| 3 | 64 | 65 | 66 | 67 | 68 | 69 | 70 | 71 | 72 | 73 | 74 | 75 | 76 | 77 | 78 | 79 |
| 4 | 64 | 65 | 66 | 67 | 68 | 69 | 70 | 71 | 72 | 73 | 74 | 75 | 76 | 77 | 78 | 79 |
| 5 | x | x | x | x | x | x | x | x | x | x | x | x | x | x | x | x |
| 6 | 0 | 1 | 2 | 3 | 4 | 5 | 6 | 7 | 8 | 9 | 10 | 11 | 12 | 13 | 14 | 15 |

| MN | 80 | 81 | 82 | 83 | 84 | 85 | 86 | 87 | 88 | 89 | 90 | 91 | 92 | 93 | 94 | 95 |
|---|---|---|---|---|---|---|---|---|---|---|---|---|---|---|---|---|
| 1 | 16 | 17 | 18 | 19 | 20 | 21 | 22 | 23 | 24 | 25 | 26 | 27 | 28 | 29 | 30 | 31 |
| 2 | x | x | x | x | x | x | x | x | x | x | x | x | x | x | x | x |
| 3 | 80 | 81 | 82 | 83 | 84 | 85 | 86 | 87 | 88 | 89 | 90 | 91 | 92 | 93 | 94 | 95 |
| 4 | 80 | 81 | 82 | 83 | 84 | 85 | 86 | 87 | 88 | 89 | 90 | 91 | 92 | 93 | 94 | 95 |

TABLE 4-continued

LEFT ALPHA-BETA SWAP SCHEDULE

| | | | | | | | | | | | | | | | | |
|---|---|---|---|---|---|---|---|---|---|---|---|---|---|---|---|---|
| 5 | x | x | x | x | x | x | x | x | x | x | x | x | x | x | x | x |
| 6 | 16 | 17 | 18 | 19 | 20 | 21 | 22 | 23 | 24 | 25 | 26 | 27 | 28 | 29 | 30 | 31 |
| MN | 96 | 97 | 98 | 99 | 100 | 101 | 102 | 103 | 104 | 105 | 106 | 107 | 108 | 109 | 110 | 111 |
| 1 | 32 | 33 | 34 | 35 | 36 | 37 | 38 | 39 | 40 | 41 | 42 | 43 | 44 | 45 | 46 | 47 |
| 2 | x | x | x | x | x | x | x | x | x | x | x | x | x | x | x | x |
| 3 | 96 | 97 | 98 | 99 | 100 | 101 | 102 | 103 | 104 | 105 | 106 | 107 | 108 | 109 | 110 | 111 |
| 4 | 96 | 97 | 98 | 99 | 100 | 101 | 102 | 103 | 104 | 105 | 106 | 107 | 108 | 109 | 110 | 111 |
| 5 | x | x | x | x | x | x | x | x | x | x | x | x | x | x | x | x |
| 6 | 32 | 33 | 34 | 35 | 36 | 37 | 38 | 39 | 40 | 41 | 42 | 43 | 44 | 45 | 46 | 47 |
| MN | 112 | 113 | 114 | 115 | 116 | 117 | 118 | 119 | 120 | 121 | 122 | 123 | 124 | 125 | 126 | 127 |
| 1 | 48 | 49 | 50 | 51 | 52 | 53 | 54 | 55 | 56 | 57 | 58 | 59 | 60 | 61 | 62 | 63 |
| 2 | x | x | x | x | x | x | x | x | x | x | x | x | x | x | x | x |
| 3 | 112 | 113 | 114 | 115 | 116 | 117 | 118 | 119 | 120 | 121 | 122 | 123 | 124 | 125 | 126 | 127 |
| 4 | 112 | 113 | 114 | 115 | 116 | 117 | 118 | 119 | 120 | 121 | 122 | 123 | 124 | 125 | 126 | 127 |
| 5 | x | x | x | x | x | x | x | x | x | x | x | x | x | x | x | x |
| 6 | 48 | 49 | 50 | 51 | 52 | 53 | 54 | 55 | 56 | 57 | 58 | 59 | 60 | 61 | 62 | 63 |
| MN | 128 | 129 | 130 | 131 | 132 | 133 | 134 | 135 | 136 | 137 | 138 | 139 | 140 | 141 | 142 | 143 |
| 1 | x | x | x | x | x | x | x | x | x | x | x | x | x | x | x | x |
| 2 | x | x | x | x | x | x | x | x | x | x | x | x | x | x | x | x |
| 3 | 128 | 129 | 130 | 131 | 132 | 133 | 134 | 135 | 136 | 137 | 138 | 139 | 140 | 141 | 142 | 143 |
| 4 | 128 | 129 | 130 | 131 | 132 | 133 | 134 | 135 | 136 | 137 | 138 | 139 | 140 | 141 | 142 | 143 |
| 5 | x | x | x | x | x | x | x | x | x | x | x | x | x | x | x | x |
| 6 | x | x | x | x | x | x | x | x | x | x | x | x | x | x | x | x |
| MN | 144 | 145 | 146 | 147 | 148 | 149 | 150 | 151 | 152 | 153 | 154 | 155 | 156 | 157 | 158 | 159 |
| 1 | x | x | x | x | x | x | x | x | x | x | x | x | x | x | x | x |
| 2 | x | x | x | x | x | x | x | x | x | x | x | x | x | x | x | x |
| 3 | 144 | 145 | 146 | 147 | 148 | 149 | 150 | 151 | 152 | 153 | 154 | 155 | 156 | 157 | 158 | 159 |
| 4 | 144 | 145 | 146 | 147 | 148 | 149 | 150 | 151 | 152 | 153 | 154 | 155 | 156 | 157 | 158 | 159 |
| 5 | x | x | x | x | x | x | x | x | x | x | x | x | x | x | x | x |
| 6 | x | x | x | x | x | x | x | x | x | x | x | x | x | x | x | x |
| MN | 160 | 161 | 162 | 163 | 164 | 165 | 166 | 167 | 168 | 169 | 170 | 171 | 172 | 173 | 174 | 175 |
| 1 | x | x | x | x | x | x | x | x | x | x | x | x | x | x | x | x |
| 2 | x | x | x | x | x | x | x | x | x | x | x | x | x | x | x | x |
| 3 | 160 | 161 | 162 | 163 | 164 | 165 | 166 | 167 | 168 | 169 | 170 | 171 | 172 | 173 | 174 | 175 |
| 4 | 160 | 161 | 162 | 163 | 164 | 165 | 166 | 167 | 168 | 169 | 170 | 171 | 172 | 173 | 174 | 175 |
| 5 | x | x | x | x | x | x | x | x | x | x | x | x | x | x | x | x |
| 6 | x | x | x | x | x | x | x | x | x | x | x | x | x | x | x | x |
| MN | 176 | 177 | 178 | 179 | 180 | 181 | 182 | 183 | 184 | 185 | 186 | 187 | 188 | 189 | 190 | 191 |
| 1 | x | x | x | x | x | x | x | x | x | x | x | x | x | x | x | x |
| 2 | x | x | x | x | x | x | x | x | x | x | x | x | x | x | x | x |
| 3 | 176 | 177 | 178 | 179 | 180 | 181 | 182 | 183 | 184 | 185 | 186 | 187 | 188 | 189 | 190 | 191 |
| 4 | 176 | 177 | 178 | 179 | 180 | 181 | 182 | 183 | 184 | 185 | 186 | 187 | 188 | 189 | 190 | 191 |
| 5 | x | x | x | x | x | x | x | x | x | x | x | x | x | x | x | x |
| 6 | x | x | x | x | x | x | x | x | x | x | x | x | x | x | x | x |
| MN | 192 | 193 | 194 | 195 | 196 | 197 | 198 | 199 | 200 | 201 | 202 | 203 | 204 | 205 | 206 | 207 |
| 1 | x | x | x | x | x | x | x | x | x | x | x | x | x | x | x | x |
| 2 | x | x | x | x | x | x | x | x | x | x | x | x | x | x | x | x |
| 3 | 192 | 193 | 194 | 195 | 196 | 197 | 198 | 199 | 200 | 201 | 202 | 203 | 204 | 205 | 206 | 207 |
| 4 | 192 | 193 | 194 | 195 | 196 | 197 | 198 | 199 | 200 | 201 | 202 | 203 | 204 | 205 | 206 | 207 |
| 5 | x | x | x | x | x | x | x | x | x | x | x | x | x | x | x | x |
| 6 | x | x | x | x | x | x | x | x | x | x | x | x | x | x | x | x |
| MN | 208 | 209 | 210 | 211 | 212 | 213 | 214 | 215 | 216 | 217 | 218 | 219 | 220 | 221 | 222 | 223 |
| 1 | x | x | x | x | x | x | x | x | x | x | x | x | x | x | x | x |
| 2 | x | x | x | x | x | x | x | x | x | x | x | x | x | x | x | x |
| 3 | 208 | 209 | 210 | 211 | 212 | 213 | 214 | 215 | 216 | 217 | 218 | 219 | 220 | 221 | 222 | 223 |
| 4 | 208 | 209 | 210 | 211 | 212 | 213 | 214 | 215 | 216 | 217 | 218 | 219 | 220 | 221 | 222 | 223 |

TABLE 4-continued

LEFT ALPHA-BETA SWAP SCHEDULE

| | | | | | | | | | | | | | | | | |
|---|---|---|---|---|---|---|---|---|---|---|---|---|---|---|---|---|
| 5 | x | x | x | x | x | x | x | x | x | x | x | x | x | x | x | x |
| 6 | x | x | x | x | x | x | x | x | x | x | x | x | x | x | x | x |

| MN | 224 | 225 | 226 | 227 | 228 | 229 | 230 | 231 | 232 | 233 | 234 | 235 | 236 | 237 | 238 | 239 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 224 | 225 | 226 | 227 | 228 | 229 | 230 | 231 | 232 | 233 | 234 | 235 | 236 | 237 | 238 | 239 |
| 4 | 224 | 225 | 226 | 227 | 228 | 229 | 230 | 231 | 232 | 233 | 234 | 235 | 236 | 237 | 238 | 239 |
| 5 | x | x | x | x | x | x | x | x | x | x | x | x | x | x | x | x |
| 6 | x | x | x | x | x | x | x | x | x | x | x | x | x | x | x | x |

| MN | 240 | 241 | 242 | 243 | 244 | 245 | 246 | 247 | 248 | 249 | 250 | 251 | 252 | 253 | 254 | 255 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 240 | 241 | 242 | 243 | 244 | 245 | 246 | 247 | 248 | 249 | 250 | 251 | 252 | 253 | 254 | 255 |
| 4 | 240 | 241 | 242 | 243 | 244 | 245 | 246 | 247 | 248 | 249 | 250 | 251 | 252 | 253 | 254 | 255 |
| 5 | x | x | x | x | x | x | x | x | x | x | x | x | x | x | x | x |
| 6 | x | x | x | x | x | x | x | x | x | x | x | x | x | x | x | x |

TABLE 5

RIGHT ALPHA-BETA SWAP SCHEDULE

| MN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | x | x | x | x | x | x | x | x | x | x | x | x | x | x | x | x |
| 2 | 0 | 1 | 2 | 3 | 4 | 5 | 6 | 7 | x | x | x | x | x | x | x | x |
| 3 | 0 | 1 | 2 | 3 | 4 | 5 | 6 | 7 | 8 | 9 | 10 | 11 | 12 | 13 | 14 | 15 |
| 4 | 0 | 1 | 2 | 3 | 4 | 5 | 6 | 7 | 8 | 9 | 10 | 11 | 12 | 13 | 14 | 15 |
| 5 | 0 | 1 | 2 | 3 | 4 | 5 | 6 | 7 | x | x | x | x | x | x | x | x |
| 6 | x | x | x | x | x | x | x | x | x | x | x | x | x | x | x | x |

| MN | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 16 | 17 | 18 | 19 | 20 | 21 | 22 | 23 | 24 | 25 | 26 | 27 | 28 | 29 | 30 | 31 |
| 4 | 16 | 17 | 18 | 19 | 20 | 21 | 22 | 23 | 24 | 25 | 26 | 27 | 28 | 29 | 30 | 31 |
| 5 | x | x | x | x | x | x | x | x | x | x | x | x | x | x | x | x |
| 5 | x | x | x | x | x | x | x | x | x | x | x | x | x | x | x | x |

| MN | 32 | 33 | 34 | 35 | 36 | 37 | 38 | 39 | 40 | 41 | 42 | 43 | 44 | 45 | 46 | 47 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 32 | 33 | 34 | 35 | 36 | 37 | 38 | 39 | 40 | 41 | 42 | 43 | 44 | 45 | 46 | 47 |
| 4 | 32 | 33 | 34 | 35 | 36 | 37 | 38 | 39 | 40 | 41 | 42 | 43 | 44 | 45 | 46 | 47 |
| 5 | x | x | x | x | x | x | x | x | x | x | x | x | x | x | x | x |
| 6 | x | x | x | x | x | x | x | x | x | x | x | x | x | x | x | x |

| MN | 48 | 49 | 50 | 51 | 52 | 53 | 54 | 55 | 56 | 57 | 58 | 59 | 60 | 61 | 62 | 63 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 48 | 49 | 50 | 51 | 52 | 53 | 54 | 55 | 56 | 57 | 58 | 59 | 60 | 61 | 62 | 63 |
| 4 | 48 | 49 | 50 | 51 | 52 | 53 | 54 | 55 | 56 | 57 | 58 | 59 | 60 | 61 | 62 | 63 |
| 5 | x | x | x | x | x | x | x | x | x | x | x | x | x | x | x | x |
| 6 | x | x | x | x | x | x | x | x | x | x | x | x | x | x | x | x |

| MN | 64 | 65 | 66 | 67 | 68 | 69 | 70 | 71 | 72 | 73 | 74 | 75 | 76 | 77 | 78 | 79 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 64 | 65 | 66 | 67 | 68 | 69 | 70 | 71 | 72 | 73 | 74 | 75 | 76 | 77 | 78 | 79 |
| 4 | 64 | 65 | 66 | 67 | 68 | 69 | 70 | 71 | 72 | 73 | 74 | 75 | 76 | 77 | 78 | 79 |
| 5 | x | x | x | x | x | x | x | x | x | x | x | x | x | x | x | x |
| 6 | x | x | x | x | x | x | x | x | x | x | x | x | x | x | x | x |

| MN | 80 | 81 | 82 | 83 | 84 | 85 | 86 | 87 | 88 | 89 | 90 | 91 | 92 | 93 | 94 | 95 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 80 | 81 | 82 | 83 | 84 | 85 | 86 | 87 | 88 | 89 | 90 | 91 | 92 | 93 | 94 | 95 |

TABLE 5-continued

RIGHT ALPHA-BETA SWAP SCHEDULE

| | | | | | | | | | | | | | | | | |
|---|---|---|---|---|---|---|---|---|---|---|---|---|---|---|---|---|
| 4 | 80 | 81 | 82 | 83 | 84 | 85 | 86 | 87 | 88 | 89 | 90 | 91 | 92 | 93 | 94 | 95 |
| 5 | x | x | x | x | x | x | x | x | x | x | x | x | x | x | x | x |
| 6 | x | x | x | x | x | x | x | x | x | x | x | x | x | x | x | x |
| MN | 96 | 97 | 98 | 99 | 100 | 101 | 102 | 103 | 104 | 105 | 106 | 107 | 108 | 109 | 110 | 111 |
| 1 | x | x | x | x | x | x | x | x | x | x | x | x | x | x | x | x |
| 2 | x | x | x | x | x | x | x | x | x | x | x | x | x | x | x | x |
| 3 | 96 | 97 | 98 | 99 | 100 | 101 | 102 | 103 | 104 | 105 | 106 | 107 | 108 | 109 | 110 | 111 |
| 4 | 96 | 97 | 98 | 99 | 100 | 101 | 102 | 103 | 104 | 105 | 106 | 107 | 108 | 109 | 110 | 111 |
| 5 | x | x | x | x | x | x | x | x | x | x | x | x | x | x | x | x |
| 6 | x | x | x | x | x | x | x | x | x | x | x | x | x | x | x | x |
| MN | 112 | 113 | 114 | 115 | 116 | 117 | 118 | 119 | 120 | 121 | 122 | 123 | 124 | 125 | 126 | 127 |
| 1 | x | x | x | x | x | x | x | x | x | x | x | x | x | x | x | x |
| 2 | x | x | x | x | x | x | x | x | x | x | x | x | x | x | x | x |
| 3 | 112 | 113 | 114 | 115 | 116 | 117 | 118 | 119 | 120 | 121 | 122 | 123 | 124 | 125 | 126 | 127 |
| 4 | 112 | 113 | 114 | 115 | 116 | 117 | 118 | 119 | 120 | 121 | 122 | 123 | 124 | 125 | 126 | 127 |
| 5 | x | x | x | x | x | x | x | x | x | x | x | x | x | x | x | x |
| 6 | x | x | x | x | x | x | x | x | x | x | x | x | x | x | x | x |
| MN | 128 | 129 | 130 | 131 | 132 | 133 | 134 | 135 | 136 | 137 | 138 | 139 | 140 | 141 | 142 | 143 |
| 1 | x | x | x | x | x | x | x | x | x | x | x | x | x | x | x | x |
| 2 | x | x | x | x | x | x | x | x | x | x | x | x | x | x | x | x |
| 3 | 128 | 129 | 130 | 131 | 132 | 133 | 134 | 135 | 136 | 137 | 138 | 139 | 140 | 141 | 142 | 143 |
| 4 | 128 | 129 | 130 | 131 | 132 | 133 | 134 | 135 | 136 | 137 | 138 | 139 | 140 | 141 | 142 | 143 |
| 5 | x | x | x | x | x | x | x | x | x | x | x | x | x | x | x | x |
| 6 | x | x | x | x | x | x | x | x | x | x | x | x | x | x | x | x |
| MN | 144 | 145 | 146 | 147 | 148 | 149 | 150 | 151 | 152 | 153 | 154 | 155 | 156 | 157 | 158 | 159 |
| 1 | x | x | x | x | x | x | x | x | x | x | x | x | x | x | x | x |
| 2 | x | x | x | x | x | x | x | x | x | x | x | x | x | x | x | x |
| 3 | 144 | 145 | 146 | 147 | 148 | 149 | 150 | 151 | 152 | 153 | 154 | 155 | 156 | 157 | 158 | 159 |
| 4 | 144 | 145 | 146 | 147 | 148 | 149 | 150 | 151 | 152 | 153 | 154 | 155 | 156 | 157 | 158 | 159 |
| 5 | x | x | x | x | x | x | x | x | x | x | x | x | x | x | x | x |
| 6 | x | x | x | x | x | x | x | x | x | x | x | x | x | x | x | x |
| MN | 160 | 161 | 162 | 163 | 164 | 165 | 166 | 167 | 168 | 169 | 170 | 171 | 172 | 173 | 174 | 175 |
| 1 | x | x | x | x | x | x | x | x | x | x | x | x | x | x | x | x |
| 2 | x | x | x | x | x | x | x | x | x | x | x | x | x | x | x | x |
| 3 | 160 | 161 | 162 | 163 | 164 | 165 | 166 | 167 | 168 | 169 | 170 | 171 | 172 | 173 | 174 | 175 |
| 4 | 160 | 161 | 162 | 163 | 164 | 165 | 166 | 167 | 168 | 169 | 170 | 171 | 172 | 173 | 174 | 175 |
| 5 | x | x | x | x | x | x | x | x | x | x | x | x | x | x | x | x |
| 6 | x | x | x | x | x | x | x | x | x | x | x | x | x | x | x | x |
| MN | 176 | 177 | 178 | 179 | 180 | 181 | 182 | 183 | 184 | 185 | 186 | 187 | 188 | 189 | 190 | 191 |
| 1 | x | x | x | x | x | x | x | x | x | x | x | x | x | x | x | x |
| 2 | x | x | x | x | x | x | x | x | x | x | x | x | x | x | x | x |
| 3 | 176 | 177 | 178 | 179 | 180 | 181 | 182 | 183 | 184 | 185 | 186 | 187 | 188 | 189 | 190 | 191 |
| 4 | 176 | 177 | 178 | 179 | 180 | 181 | 182 | 183 | 184 | 185 | 186 | 187 | 188 | 189 | 190 | 191 |
| 5 | x | x | x | x | x | x | x | x | x | x | x | x | x | x | x | x |
| 6 | x | x | x | x | x | x | x | x | x | x | x | x | x | x | x | x |
| MN | 192 | 193 | 194 | 195 | 196 | 197 | 198 | 199 | 200 | 201 | 202 | 203 | 204 | 205 | 206 | 207 |
| 1 | x | x | x | x | x | x | x | x | x | x | x | x | x | x | x | x |
| 2 | x | x | x | x | x | x | x | x | x | x | x | x | x | x | x | x |
| 3 | 192 | 193 | 194 | 195 | 196 | 197 | 198 | 199 | 200 | 201 | 202 | 203 | 204 | 205 | 206 | 207 |
| 4 | 192 | 193 | 194 | 195 | 196 | 197 | 198 | 199 | 200 | 201 | 202 | 203 | 204 | 205 | 206 | 207 |
| 5 | x | x | x | x | x | x | x | x | x | x | x | x | x | x | x | x |
| 6 | x | x | x | x | x | x | x | x | x | x | x | x | x | x | x | x |
| MN | 208 | 209 | 210 | 211 | 212 | 213 | 214 | 215 | 216 | 217 | 218 | 219 | 220 | 221 | 222 | 223 |
| 1 | x | x | x | x | x | x | x | x | x | x | x | x | x | x | x | x |
| 2 | x | x | x | x | x | x | x | x | x | x | x | x | x | x | x | x |
| 3 | 208 | 209 | 210 | 211 | 212 | 213 | 214 | 215 | 216 | 217 | 218 | 219 | 220 | 221 | 222 | 223 |
| 4 | 208 | 209 | 210 | 211 | 212 | 213 | 214 | 215 | 216 | 217 | 218 | 219 | 220 | 221 | 222 | 223 |

TABLE 5-continued

RIGHT ALPHA-BETA SWAP SCHEDULE

| | | | | | | | | | | | | | | | | |
|---|---|---|---|---|---|---|---|---|---|---|---|---|---|---|---|---|
| 5 | x | x | x | x | x | x | x | x | x | x | x | x | x | x | x | x |
| 6 | x | x | x | x | x | x | x | x | x | x | x | x | x | x | x | x |

| MN | 224 | 225 | 226 | 227 | 228 | 229 | 230 | 231 | 232 | 233 | 234 | 235 | 236 | 237 | 238 | 239 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 224 | 225 | 226 | 227 | 228 | 229 | 230 | 231 | 232 | 233 | 234 | 235 | 236 | 237 | 238 | 239 |
| 4 | 224 | 225 | 226 | 227 | 228 | 229 | 230 | 231 | 232 | 233 | 234 | 235 | 236 | 237 | 238 | 239 |
| 5 | x | x | x | x | x | x | x | x | x | x | x | x | x | x | x | x |
| 6 | x | x | x | x | x | x | x | x | x | x | x | x | x | x | x | x |

| MN | 240 | 241 | 242 | 243 | 244 | 245 | 246 | 247 | 248 | 249 | 250 | 251 | 252 | 253 | 254 | 255 |
|---|---|---|---|---|---|---|---|---|---|---|---|---|---|---|---|---|
| 1 | x | x | x | x | x | x | x | x | x | x | x | x | x | x | x | x |
| 2 | x | x | x | x | x | x | x | x | x | x | x | x | x | x | x | x |
| 3 | 240 | 241 | 242 | 243 | 244 | 245 | 246 | 247 | 248 | 249 | 250 | 251 | 252 | 253 | 254 | 255 |
| 4 | 240 | 241 | 242 | 243 | 244 | 245 | 246 | 247 | 248 | 249 | 250 | 251 | 252 | 253 | 254 | 255 |
| 5 | x | x | x | x | x | x | x | x | x | x | x | x | x | x | x | x |
| 6 | x | x | x | x | x | x | x | x | x | x | x | x | x | x | x | x |

TABLE 6

ALPHA SWAP SCHEDULE

| MN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 1 | x | x | 2 | 3 | x | x | 4 | 5 | x | x | 6 | 7 | x | x |
| 2 | 0 | 1 | 6 | 7 | 2 | 3 | 4 | 5 | 2 | 3 | 4 | 5 | 0 | 1 | 6 | 7 |
| 3 | 0 | 1 | x | x | 2 | 3 | x | x | 4 | 5 | x | x | 6 | 7 | x | x |
| 4 | 0 | 1 | x | x | 2 | 3 | x | x | 4 | 5 | x | x | 6 | 7 | x | x |
| 5 | 0 | 1 | x | x | 2 | 3 | x | x | 4 | 5 | x | x | 6 | 7 | x | x |
| 6 | 0 | 1 | x | x | 2 | 3 | x | x | 4 | 5 | x | x | 6 | 7 | x | x |

| MN | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 1 | 8 | 9 | x | x | 10 | 11 | x | x | 12 | 13 | x | x | 14 | 15 | x | x |
| 2 | 0 | 1 | 6 | 7 | 2 | 3 | 4 | 5 | 2 | 3 | 4 | 5 | 0 | 1 | 6 | 7 |
| 3 | 8 | 9 | x | x | 10 | 11 | x | x | 12 | 13 | x | x | 14 | 15 | x | x |
| 4 | 8 | 9 | x | x | 10 | 11 | x | x | 12 | 13 | x | x | 14 | 15 | x | x |
| 5 | 0 | 1 | x | x | 2 | 3 | x | x | 4 | 5 | x | x | 6 | 7 | x | x |
| 6 | 8 | 9 | x | x | 10 | 11 | x | x | 12 | 13 | x | x | 14 | 15 | x | x |

TABLE 7

BETA SWAP SCHEDULE

| MN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 32 | x | x | 0 | 32 | x | x | 1 | 33 | x | x | 1 | 33 | x | x |
| 2 | 0 | 4 | 7 | 3 | 4 | 0 | 3 | 7 | 1 | 5 | 6 | 2 | 5 | 1 | 2 | 6 |
| 3 | 0 | 128 | x | x | 0 | 128 | x | x | 1 | 129 | x | x | 1 | 129 | x | x |
| 3 | 0 | 128 | x | x | 0 | 128 | x | x | 1 | 129 | x | x | 1 | 129 | x | x |
| 5 | 0 | 4 | x | x | 4 | 0 | x | x | 5 | 1 | x | x | 1 | 5 | x | x |
| 6 | 0 | 32 | x | x | 0 | 32 | x | x | 1 | 33 | x | x | 1 | 33 | x | x |

| MN | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 1 | 2 | 34 | x | x | 2 | 34 | x | x | 3 | 35 | x | x | 3 | 35 | x | x |
| 2 | 6 | 2 | 1 | 5 | 2 | 6 | 5 | 1 | 7 | 3 | 0 | 4 | 3 | 7 | 4 | 0 |
| 3 | 2 | 130 | x | x | 2 | 130 | x | x | 3 | 131 | x | x | 3 | 131 | x | x |
| 4 | 2 | 130 | x | x | 2 | 130 | x | x | 3 | 131 | x | x | 3 | 131 | x | x |
| 5 | 2 | 6 | x | x | 6 | 2 | x | x | 7 | 3 | x | x | 3 | 7 | x | x |
| 6 | 2 | 34 | x | x | 2 | 34 | x | x | 3 | 35 | x | x | 3 | 35 | x | x |

TABLE 8

LEFT GAMMA SWAP SCHEDULE

| MN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 12 | x | x | 4 | 8 | x | x | 0 | 12 | x | x | 4 | 8 | x | x |
| 2 | 0 | 13 | 6 | 11 | 4 | 9 | 2 | 15 | 7 | 10 | 1 | 12 | 3 | 14 | 5 | 8 |
| 3 | 0 | 12 | x | x | 4 | 8 | x | x | 0 | 12 | x | x | 4 | 8 | x | x |
| 4 | 0 | 14 | x | x | 12 | 2 | x | x | 8 | 6 | x | x | 4 | 10 | x | x |
| 5 | 0 | 12 | x | x | 4 | 8 | x | x | 8 | 4 | x | x | 12 | 0 | x | x |
| 6 | 0 | 12 | x | x | 8 | 4 | x | x | 0 | 12 | x | x | 8 | 4 | x | x |

| MN | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 1 | 12 | 0 | x | x | 8 | 4 | x | x | 12 | 0 | x | x | 8 | 4 | x | x |
| 2 | 13 | 0 | 11 | 6 | 9 | 4 | 15 | 2 | 10 | 7 | 12 | 1 | 14 | 3 | 8 | 5 |
| 3 | 4 | 8 | x | x | 0 | 12 | x | x | 4 | 8 | x | x | 0 | 12 | x | x |
| 4 | 10 | 4 | x | x | 6 | 8 | x | x | 2 | 12 | x | x | 14 | 0 | x | x |
| 5 | 12 | 0 | x | x | 8 | 4 | x | x | 4 | 8 | x | x | 0 | 12 | x | x |
| 6 | 12 | 0 | x | x | 4 | 8 | x | x | 12 | 0 | x | x | 4 | 8 | x | x |

TABLE 9

RIGHT GAMMA SWAP SCHEDULE

| MN | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 1 | 0 | 12 | x | x | 12 | 0 | x | x | 4 | 8 | x | x | 8 | 4 | x | x |
| 2 | 0 | 13 | 14 | 3 | 0 | 13 | 14 | 3 | 4 | 9 | 10 | 7 | 4 | 9 | 10 | 7 |
| 3 | 0 | 12 | x | x | 12 | 0 | x | x | 4 | 8 | x | x | 8 | 4 | x | x |
| 4 | 0 | 14 | x | x | 14 | 0 | x | x | 12 | 2 | x | x | 2 | 12 | x | x |
| 5 | 0 | 12 | x | x | 0 | 12 | x | x | 8 | 4 | x | x | 8 | 4 | x | x |
| 6 | 0 | 12 | x | x | 12 | 0 | x | x | 8 | 4 | x | x | 4 | 8 | x | x |

| MN | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|
| 1 | 0 | 12 | x | x | 12 | 0 | x | x | 4 | 8 | x | x | 8 | 4 | x | x |
| 2 | 12 | 1 | 2 | 15 | 12 | 1 | 2 | 15 | 8 | 5 | 6 | 11 | 8 | 5 | 6 | 11 |
| 3 | 0 | 12 | x | x | 12 | 0 | x | x | 4 | 8 | x | x | 8 | 4 | x | x |
| 4 | 8 | 6 | x | x | 6 | 8 | x | x | 4 | 10 | x | x | 10 | 4 | x | x |
| 5 | 8 | 4 | x | x | 8 | 4 | x | x | 0 | 12 | x | x | 0 | 12 | x | x |
| 6 | 0 | 12 | x | x | 12 | 0 | x | x | 8 | 4 | x | x | 4 | 8 | x | x |

The techniques and structures of the present invention may be implemented in any of a variety of different forms. The unified decoder may be implemented as, for example, a standalone component (e.g., a decoder chip, etc.). The decoder may also be implemented as part of a larger system, such as a wireless communication device. For example, features of the invention may be embodied within laptop, palmtop, desktop, and tablet computers having wireless capability; personal digital assistants (PDAs) having wireless capability; cellular telephones and other handheld wireless communicators; pagers; satellite communicators; cameras having wireless capability; audio/video devices having wireless capability; network interface cards (NICs) and other network interface structures; base stations; wireless access points; and/or in other formats.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A unified decoder comprising:
   a first group of trellis processors to perform processing associated with states of a decoding trellis, said first group of trellis processors to calculate path metrics when said unified decoder is performing convolutional code decoding and to calculate alpha (forward) metrics when said unified decoder is performing Turbo code decoding and low density parity check (LDPC) code decoding;
   a second group of trellis processors to perform processing associated with states of a decoding trellis, said second group of trellis processors to calculate path metrics when said unified decoder is performing convolutional code decoding and to calculate beta (backward) metrics when said unified decoder is performing Turbo code decoding and LDPC code decoding;
   a number of reliability calculators to calculate output reliabilities, using alpha and beta metrics, when said unified decoder is performing Turbo code decoding and LDPC code decoding;
   a normalization unit to normalize metrics generated by said trellis processors;
   a first alpha-beta swap unit to controllably distribute normalized metrics to trellis processors in said first group for use in processing a next trellis stage; and a second alpha-beta swap unit to controllably distribute normalized metrics to trellis processors in said second group for use in processing a next trellis stage.

2. The unified decoder of claim 1, wherein:
said first group of trellis processors and said second group of trellis processors include the same number of trellis processors.

3. The unified decoder of claim 2, wherein:
said first group of trellis processors and said second group of trellis processors each include sixteen trellis processors.

4. The unified decoder of claim 1, wherein:
trellis processors in said first and second groups of trellis processors are each capable of performing processing for eight trellis states simultaneously.

5. The unified decoder of claim 1, further comprising:
an alpha memory to store path metrics when said unified decoder is performing convolutional code decoding and to store alpha metrics when said unified decoder is performing Turbo code decoding and LDPC code decoding; and
a beta memory to store path metrics when said unified decoder is performing convolutional code decoding and to store beta metrics when said unified decoder is performing Turbo code decoding and LDPC code decoding.

6. The unified decoder of claim 5, wherein:
said alpha and beta memories are coupled to said first and second alpha-beta swap units to distribute alpha and beta metrics to said reliability calculators for use in calculating output reliabilities when said unified decoder is performing Turbo code decoding and LDPC code decoding.

7. The unified decoder of claim 5, further comprising:
a back track unit coupled to said alpha and beta memories to trace back through a trellis along a selected path to generate hard decision data when said unified decoder is performing convolutional code decoding.

8. The unified decoder of claim 7, wherein:
said back track unit is powered down when said unified decoder is performing Turbo code decoding and LDPC code decoding.

9. The unified decoder of claim 1, further comprising:
a first delay unit between said normalization unit and inputs of said first and second alpha-beta swap units to delay the input of normalized metrics to said first and second alpha-beta swap units; and
a second delay unit between said normalization unit and other inputs of said first and second alpha-beta swap units to delay the input of normalized metrics to said first and second alpha-beta swap units.

10. The unified decoder of claim 1, wherein:
said reliability calculators are powered down when said unified decoder is performing convolutional code decoding.

11. A unified decoder comprising:
a number of configuration switch units that allow said unified decoder to be reconfigured dynamically during operation for use with convolutional codes, Turbo codes, and low density parity check (LDPC) codes;
said configuration switch units include:
a first alpha-beta swap unit to controllably distribute alpha metrics to a first group of trellis processors for use in generating updated alpha metrics when said unified decoder is performing Turbo code decoding and LDPC code decoding, and
a second alpha-beta swap unit to controllably distribute beta metrics to a second group of trellis processors for use in generating updated beta metrics when said unified decoder is performing Turbo code decoding and LDPC code decoding; and
a controller to send configuration information to said configuration switch units based on a type of code that is currently being processed.

12. The unified decoder of claim 11, wherein:
said first alpha-beta swap unit distributes path metrics from a previous trellis stage to trellis processors in said first group of trellis processors so that said trellis processors in said first group of trellis processors can calculate path metrics for a current trellis stage when said unified decoder is performing convolutional code decoding; and
said second alpha-beta swap unit distributes path metrics from said previous trellis stage to trellis processors in said second group of trellis processors so that said trellis processors in said second group of trellis processors can calculate path metrics for said current trellis stage.

13. A decoding method comprising:
determining whether encoded data has been encoded with a convolutional code, a Turbo code, or a low density parity check (LDPC) code;
when said encoded data has been encoded with a convolutional code, delivering input reliabilities associated with said encoded data to trellis processors in a first group of trellis processors and trellis processors in a second group of trellis processors for use in calculating path metrics; and
when said encoded data has been encoded with a Turbo code or an LDPC code, delivering input reliabilities associated with said encoded data to trellis processors in said first group for use in calculating alpha metrics and delivering input reliabilities associated with said encoded data to trellis processors in said second group for use in calculating beta metrics.

14. The method of claim 13, wherein:
said first group of trellis processors and said second group of trellis processors have an equal number of processors.

15. The method of claim 13, further comprising:
when said encoded data has been encoded with a Turbo code or an LDPC code:
normalizing alpha metrics generated by said first group of trellis processors and storing said normalized alpha metrics in an alpha memory; and
normalizing beta metrics generated by said second group of trellis processors and storing said normalized beta metrics in a beta memory.

* * * * *